(12) United States Patent
Oh et al.

(10) Patent No.: US 12,225,274 B2
(45) Date of Patent: Feb. 11, 2025

(54) DISPLAY DEVICE AND METHOD OF SYNTHESIZING IMAGES

(71) Applicant: LG Display Co., Ltd., Seoul (KR)

(72) Inventors: Seung Taek Oh, Paju-si (KR); Bo Yun Jung, Paju-si (KR); Bo Gun Seo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 178 days.

(21) Appl. No.: 17/974,444

(22) Filed: Oct. 26, 2022

(65) Prior Publication Data

US 2023/0133190 A1 May 4, 2023

(30) Foreign Application Priority Data

Oct. 29, 2021 (KR) .................. 10-2021-0146780
Nov. 16, 2021 (KR) .................. 10-2021-0157602

(51) Int. Cl.
| | | |
|---|---|---|
| *H04N 23/45* | (2023.01) | |
| *H04N 23/53* | (2023.01) | |
| *H04N 23/57* | (2023.01) | |
| *H04N 23/58* | (2023.01) | |
| *H04N 23/611* | (2023.01) | |
| *H04N 23/951* | (2023.01) | |
| *H10K 59/65* | (2023.01) | |

(52) U.S. Cl.
CPC ............. *H04N 23/45* (2023.01); *H04N 23/53* (2023.01); *H04N 23/57* (2023.01); *H04N 23/611* (2023.01); *H04N 23/951* (2023.01); *H04N 23/58* (2023.01); *H10K 59/65* (2023.02)

(58) Field of Classification Search
None
See application file for complete search history.

(56) References Cited

U.S. PATENT DOCUMENTS

| | | | | |
|---|---|---|---|---|
| 2017/0171465 A1* | 6/2017 | Chen | ...................... | H04N 25/48 |
| 2017/0287992 A1* | 10/2017 | Kwak | .................... | G06F 1/1637 |
| 2018/0109710 A1* | 4/2018 | Lee | ..................... | H04N 23/6812 |
| 2019/0373166 A1* | 12/2019 | Jia | .......................... | G09G 3/2003 |
| 2020/0195764 A1* | 6/2020 | Xu | .......................... | H04N 23/45 |
| 2022/0294986 A1* | 9/2022 | Ha | ......................... | G01S 3/7864 |

* cited by examiner

*Primary Examiner* — Paul M Berardesca
(74) *Attorney, Agent, or Firm* — Seed IP Law Group LLP

(57) ABSTRACT

An embodiment discloses a display device including a display panel including a first display area and a second display area, a first image capturing assembly and a second image capturing assembly disposed below the second display area, and a rotating assembly configured to rotate the second image capturing assembly.

17 Claims, 30 Drawing Sheets

DISPLAY DEVICE AND METHOD OF SYNTHESIZING IMAGES

CROSS-REFERENCE TO RELATED APPLICATION

This application claims priority to and the benefit of Korean Patent Applications No. 10-2021-0146780, filed Oct. 29, 2021, and No. 10-2021-0157602, filed Nov. 16, 2021, the disclosure of which is incorporated herein by reference in its entirety.

BACKGROUND

Technical Field

An embodiment relates to a display device.

Description of Related Art

Electroluminescent display devices are classified into inorganic light-emitting display devices and organic light-emitting display devices depending on materials of an emission layer. An active-matrix-type organic light-emitting display device includes an organic light-emitting diode (OLED) that emits light by itself and has advantages of a quick response time, high light emission efficiency, high luminance, and a wide viewing angle. The organic light-emitting display device has OLEDs formed in each pixel. The organic light-emitting display device may represent a black grayscale as perfect black as well as having a quick response time, high light emission efficiency, high luminance, and a wide viewing angle, and thus has an excellent contrast ratio and color gamut.

Recently, multimedia functions of a mobile terminal have been improved. For example, a camera is basically built in a mobile terminal and the resolution of the camera is increasing to a level of an existing digital camera. However, a front camera of the mobile terminal limits the design of a screen, thereby making it difficult to design the screen. In order to reduce the space occupied by the camera, a screen design including a notch or a punch hole has been adopted in the mobile terminal.

BRIEF SUMMARY

The inventors have realized that it is difficult to implement a full-screen display because a screen size is still limited due to the camera.

In order to implement a full-screen display, a method of preparing an image capturing area in which low-resolution pixels are disposed in a screen of a display panel, and disposing a camera and/or various sensors in the image capturing area, has been proposed.

An embodiment provides a display device capable of improving the quality of an image captured by a front camera.

It should be noted that technical benefits of the present disclosure are not limited to the above-described technical benefit, and other technical benefits of the present disclosure will be apparent to those skilled in the art from the following descriptions.

According to an aspect of the present disclosure, there is provided a display device including a display panel including a first display area and a second display area having a lower pixel density than the first display area, a first image capturing assembly and a second image capturing assembly disposed below the second display area, and a rotating assembly configured to rotate the second image capturing assembly.

BRIEF DESCRIPTION OF THE SEVERAL VIEWS OF THE DRAWINGS

The above and other technical benefits, features, and advantages of the present disclosure will become more apparent to those of ordinary skill in the art by describing example embodiments thereof in detail with reference to the accompanying drawings, in which.

DETAILED DESCRIPTION

Figure 1:
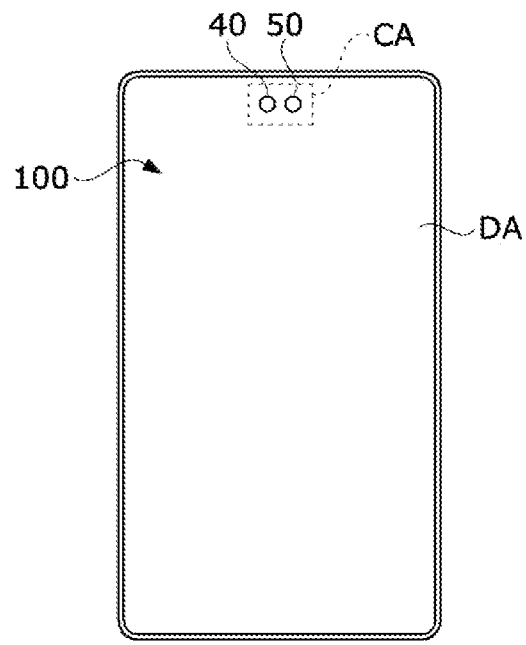
FIG. 1 is a conceptual diagram of a display device according to one embodiment of the present disclosure.

Advantages and features of the present disclosure and implementation methods thereof will be clarified through the following embodiments described with reference to the accompanying drawings. However, the present disclosure is not limited to the embodiments described below and may be embodied with a variety of different modifications. The embodiments are merely provided to allow those skilled in the art to completely understand the scope of the present disclosure.

The figures, dimensions, ratios, angles, numbers, and the like disclosed in the drawings for describing the embodiments of the present disclosure are merely illustrative and are not limited to matters shown in the present disclosure. Throughout the specification, like reference numerals refer to like elements. Further, in describing the present disclosure, detailed descriptions of well-known technologies will be omitted when it is determined that they may unnecessarily obscure the gist of the present disclosure.

Terms such as "including," "having," and "composed of" used herein are intended to allow other elements to be added unless the terms are used with the term "only." Any references to the singular may include the plural unless expressly stated otherwise.

Components are interpreted to include an ordinary error range even if not expressly stated.

For description of a positional relationship, for example, when the positional relationship between two parts is described as "on," "above," "below," and "next to," etc., one or more parts may be interposed therebetween unless the term "immediately" or "directly" is used in the expression.

In the description of embodiments, the terms "first," "second," and the like may be used herein to describe various components, the components are not limited by the terms. These terms are used only to distinguish one component from another. Accordingly, a first component discussed below could be termed a second component without departing from the teachings of the present disclosure.

Like reference numerals refer to like components throughout the specification.

The features of various embodiments may be partially or entirely bonded to or combined with each other. The embodiments may be interoperated and performed in technically various ways and may be carried out independently of or in association with each other.

Hereinafter, various embodiments of the present disclosure will be described in detail with reference to the accompanying drawings.

Figure 2:
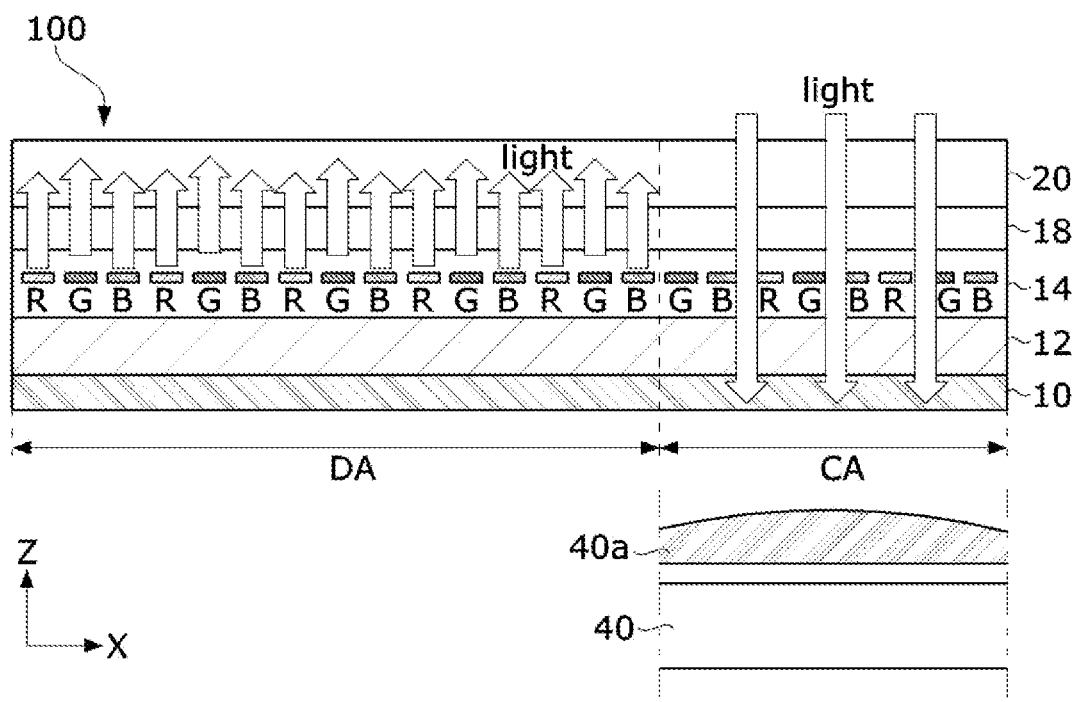
FIG. 2 is a cross-sectional view schematically illustrating a display panel according to an embodiment of the present disclosure.
Figure 3:
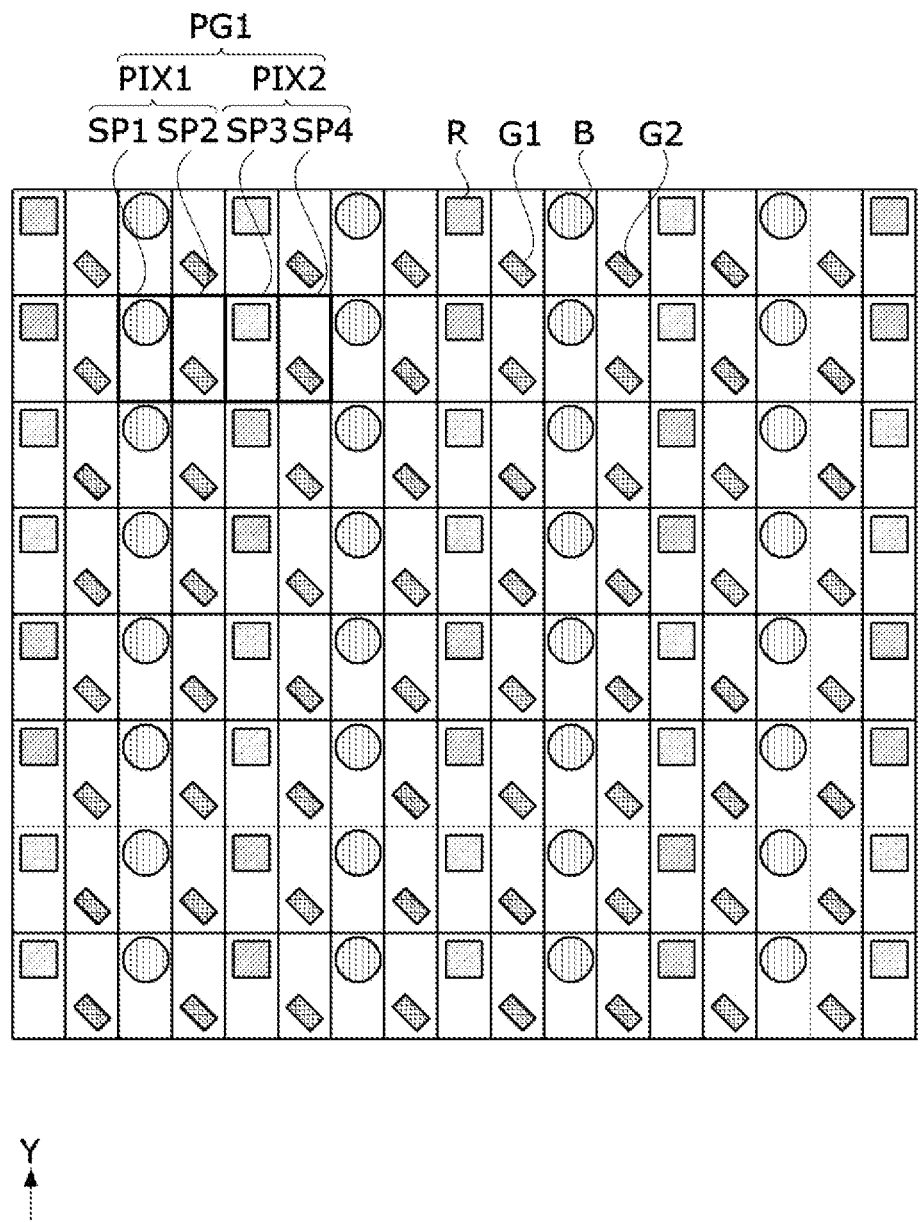
FIG. 3 is a view illustrating a pixel arrangement in a first display area according to one embodiment of the present disclosure.

FIG. 1 is a conceptual diagram of a display device according to one embodiment of the present disclosure. FIG. 2 is a cross-sectional view schematically illustrating a display panel according to an embodiment of the present disclosure. FIG. 3 is a view illustrating a pixel arrangement in a first display area according to one embodiment of the present disclosure.

Referring to FIG. 1, the display device may include a display panel 100 and a case, and a front surface of the display panel 100 may be configured as a display area. Thus, a full-screen display may be implemented.

The display area may include a first display area DA and a second display area CA. The first display area DA and the second display area CA may all output an image but may be different in resolution. As an example, a resolution of a plurality of second pixels disposed in the second display area CA may be lower than a resolution (or density) of a plurality of first pixels disposed in the first display area DA. A relatively larger amount of light may be injected into sensors 40 and 50 disposed in the second display area CA in correspondence with the resolution (or density) lowered in the plurality of second pixels disposed in the second display area CA.

However, the present disclosure is not necessarily limited thereto, and the resolution of the first display area DA and the resolution of the second display area CA may be the same as long as the second display area CA may have sufficient light transmittance or an appropriate compensation algorithm may be implemented.

The second display area CA may be an area in which the sensors 40 and 50 are disposed. The second display area CA is an area that overlaps various sensors and thus may be smaller in area than the first display area DA outputting most of the image. The second display area CA may be a sensing area in which various sensors collect information. The second display area CA is illustrated as being disposed on an upper end of the display device, but the present disclosure is not necessarily limited thereto. The position and area of the second display area CA may be variously modified. For example, the second display area CA could be disposed on a lower end, a lower left end, a lower right end, an upper left end, an upper right end or even center of the display device.

The sensors 40 and 50 may include at least one of an image sensor, a proximity sensor, an illumination sensor, a gesture sensor, a motion sensor, a fingerprint recognition sensor, and a biometric sensor. As an example, a first sensor 40 may be an image capturing unit configured to capture an image or a video, and a second sensor 50 may be an illumination sensor or an infrared sensor, but the present disclosure is not necessarily limited thereto. The image capturing assembly may be any image capturing structure and/or electronics assembly of a type known in the art, and may be referred to as the image capturing structure or image capturing assembly. It is composed of the optical lenses, memory and electronic devices for performing an image capture, such as a digital camera.

Referring to FIGS. 2 and 3, the first display area DA and the second display area CA may include a pixel array in which pixels, to which pixel data is written, are disposed. The number of pixels per unit area (hereinafter, referred to as "pixels per inch (PPI)") of the second display area CA may be lower than that of the first display area DA in order to ensure the light transmittance of the second display area CA.

The pixel array of the first display area DA may include a pixel area in which a plurality of pixel groups having a high PP1 are disposed. The pixel array of the second display area CA may include a pixel area in which a plurality of pixel groups having a relatively low PP1 are disposed by being spaced apart from each other by light-transmitting areas. In the second display area CA, external light may pass through the display panel 100 through the light-transmitting areas having high light transmittance and may be received by a sensor placed below the display panel 100.

Since both the first display area DA and the second display area CA include the pixels, an input image may be reproduced on the first display area DA and the second display area CA. Thus, a full-screen display may be implemented.

Each of the pixels of the first display area DA and the second display area CA may include sub-pixels having different colors to implement a color of an image. The sub-pixels may include red, green, and blue sub-pixels. Although not shown in the drawings, the pixel group may further include a white sub-pixel. Each of the sub-pixels may include a pixel circuit unit (or simply, "pixel circuit") and a light-emitting element (organic light-emitting diode: OLED). But the embodiments of the present disclosure are not limited thereto. For example, other combinations of colors, such as magenta, cyan and yellow, are also possible.

The second display area CA may include the pixels and the image capturing unit 40 disposed below a screen of the display panel 100. The image capturing unit 40 may include an image sensor. The image capturing unit may also be referred to as an image capturing assembly since it is an assembly of many components. The term "unit" as used herein can include within its meaning a circuit, electronic components, a mechanical structure, an assembly, or other physical structures. The pixels of the second display area CA may display an input image by writing pixel data of an input image in a display mode.

The image capturing unit 40 may capture an external image in an image capturing mode to output a picture or video image data. A lens 40a of the image capturing unit 40 may face the second display area CA. The external light is incident on the lens 40a of the image capturing unit 40 through the second display area CA, and the lens 40a may condense the light. The image capturing unit 40 may be a camera module, but is not necessarily limited thereto, and may include a variety of image acquisition devices capable of acquiring an image.

In order to ensure light transmittance, due to the pixels being removed from the second display area CA, an image quality compensation algorithm for compensating luminance and color coordinates of the pixels in the second display area CA may be applied.

The display panel 100 may have a width in an X-axis direction, a length in a Y-axis direction, and a thickness in a Z-axis direction. The display panel 100 may include a circuit layer 12 disposed on a substrate 10, and a light-emitting element layer 14 disposed on the circuit layer 12. A polarizing plate 18 may be disposed on the light-emitting element layer 14, and a cover glass 20 may be disposed on the polarizing plate 18.

The circuit layer 12 may include a pixel circuit connected to lines such as data lines, gate lines, power lines, and the like, a gate driving unit (or "gate driver") connected to the gate lines, and the like.

The circuit layer 12 may include a circuit element such as a transistor implemented as a thin-film transistor (TFT), a capacitor, and the like. The lines and circuit elements of the circuit layer 12 may be implemented with a plurality of insulating layers, two or more metal layers separated from each other with the insulating layers therebetween, and an active layer including a semiconductor material.

The light-emitting element layer 14 may include the light-emitting element driven by the pixel circuit. The light-emitting element may be implemented as an OLED. The OLED may include an organic compound layer formed between an anode and a cathode.

The organic compound layer may include a hole injection layer HIL, a hole transport layer HTL, an emission layer EML, an electron transport layer ETL, and an electron injection layer EIL, but the present disclosure is not limited thereto.

When a voltage is applied to the anode and the cathode of the OLED, holes passing through the hole transport layer HTL and electrons passing through the electron transport layer ETL move to the emission layer EML to create excitons, and thus visible light may be emitted from the emission layer EML.

The light-emitting element layer 14 may further include a color filter array disposed on the pixels that selectively transmit light of red, green, and blue wavelengths.

The light-emitting element layer 14 may be covered by a protective film, and the protective film may be covered by an encapsulation layer. The protective film and the encapsulation layer may have a structure in which organic films and inorganic films are alternately stacked. The inorganic films may block the penetration of moisture or oxygen. The organic films may planarize a surface of the inorganic film. When the organic films and the inorganic films are stacked in multiple layers, the penetration of moisture/oxygen affecting the light-emitting element layer 14 may be effectively blocked since a movement path of the moisture or oxygen is increased in length as compared with a single layer.

The polarizing plate 18 may be disposed on the encapsulation layer. The polarizing plate 18 can improve outdoor visibility of the display device. The polarizing plate 18 may reduce the reflection of light from a surface of the display panel 100 and block the light reflected from metal of the circuit layer 12, thereby improving the brightness of the pixels. The polarizing plate 18 may be implemented as a polarizing plate to which a linear polarizing plate and a phase retardation film are bonded, or a circular polarizing plate.

Referring to FIG. 3, the first display area DA may include a plurality of first pixel groups PG1 arranged in a matrix form. In the plurality of first pixel groups PG1, two sub-pixels may form one pixel using a sub-pixel rendering algorithm. For example, a first unit pixel PIX1 may include R and G1 sub-pixels SP1 and SP2, and a second unit pixel PIX2 may include B and G2 sub-pixels SP3 and SP4. Insufficient color representation in each of the unit pixels PIX1 and PIX2 may be compensated with an average value of pieces of corresponding color data between neighboring pixels. However, the present disclosure is not necessarily limited thereto, and the plurality of first pixel groups PG1 may be real-type pixels including R, G, and B sub-pixels.

Figure 4:
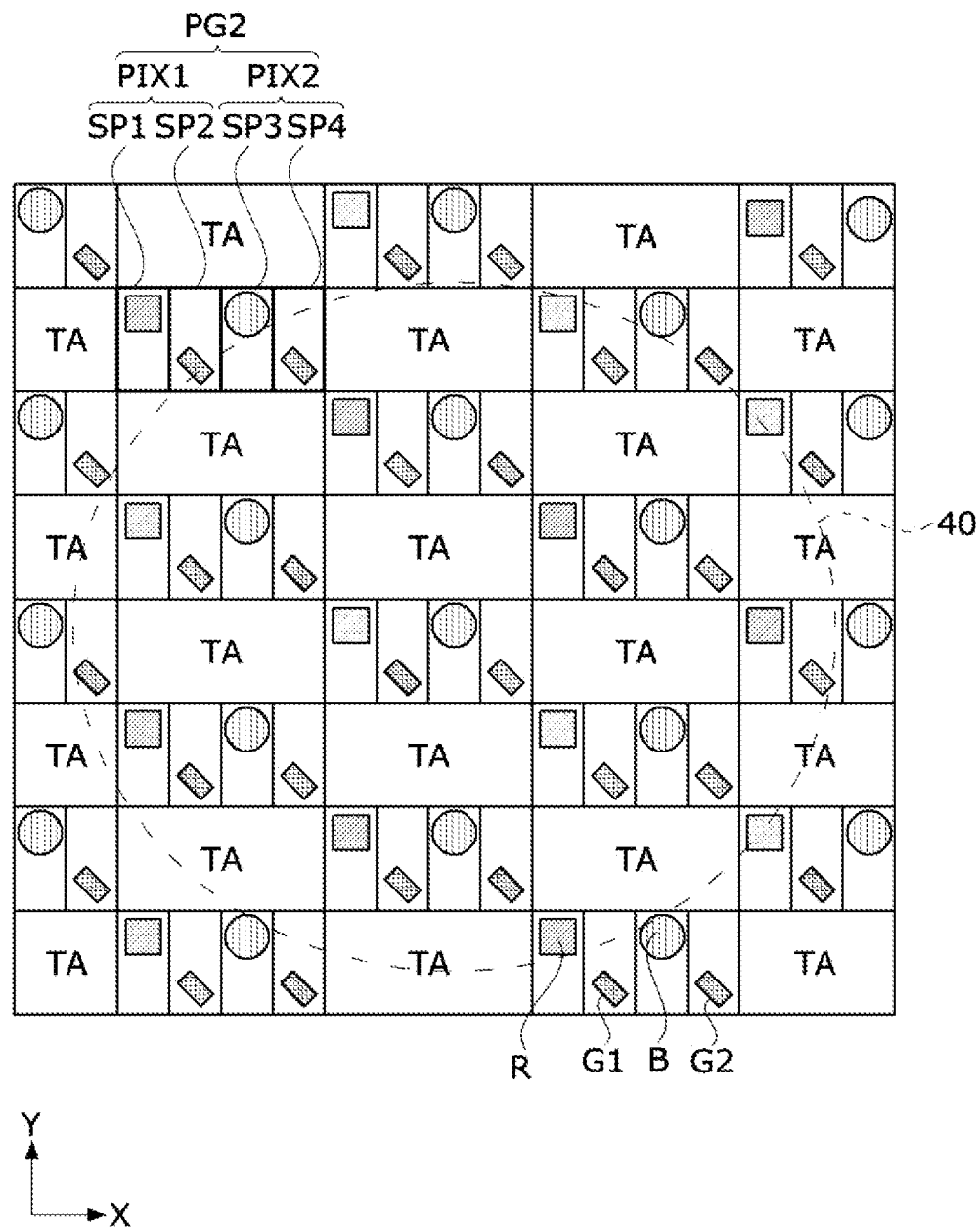
FIG. 4 is a view illustrating pixels and light-transmitting areas of a second display area.

FIG. 4 is a view illustrating pixels and light-transmitting areas of a second display area according to one embodiment of the present disclosure.

Referring to FIG. 4, the second display area CA may include a plurality of second pixel groups PG2 and a plurality of light-transmitting areas TA. The plurality of light-transmitting areas TA may be disposed between the plurality of second pixel groups PG2. Specifically, each of the light-transmitting areas TA and the second pixel groups PG2 may be alternately disposed in a first direction and a second direction. External light may be received by the image capturing unit 40 through the light-transmitting areas TA. A resolution of the second display area CA may decrease relative to a resolution of the first display area DA by the extent to which an area of the light-transmitting area TA increases.

The light-transmitting area TA may include transparent media having high light transmittance without having metal so that light may be incident with minimum or reduced light loss. The light-transmitting area TA may be made of transparent insulating materials without including metal lines or pixels. As the light-transmitting area TA becomes larger, the light transmittance of the second display area CA may be higher.

Each of the plurality of second pixel groups PG2 may include one or two pixels. For example, in each of the second pixel groups PG2, a first unit pixel PIX1 may include R and G1 sub-pixels SP1 and SP2, and a second unit pixel PIX2 may include B and G2 sub-pixels SP3 and SP4. The shape and arrangement of pixels of the second pixel group PG2 may be the same as or different from those of the first pixel group PG1.

The shape of the light-transmitting area TA is illustrated as being a quadrangular shape, but the present disclosure is not limited thereto. For example, the light-transmitting area TA may be designed in various shapes such as a circular shape, an elliptical shape, a polygonal shape, or the like.

All metal electrode materials may be removed from the light-transmitting area TA. Accordingly, lines of the pixels may be disposed outside the light-transmitting area TA. Thus, light may be effectively incident through the light-transmitting area. However, the present disclosure is not necessarily limited thereto, and the metal electrode material may be present in a partial area of the light-transmitting area TA.

Figure 5:
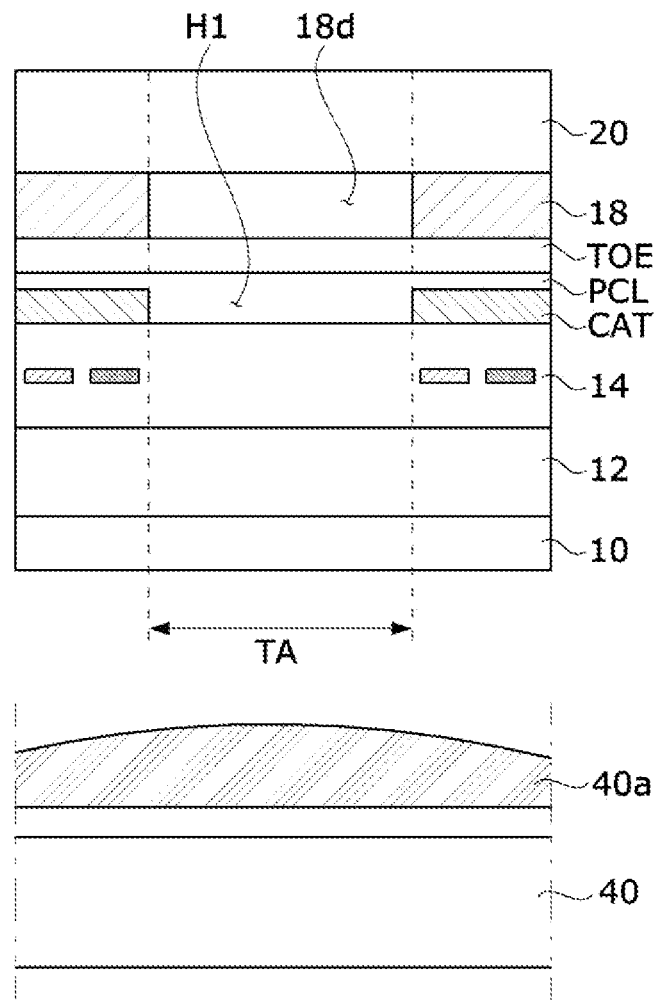
FIG. 5 is a view schematically illustrating a structure of the display panel of the second display area.

FIG. 5 is a view schematically illustrating a structure of the display panel of the second display area.

Referring to FIG. 5, the display panel may include the circuit layer 12 disposed on the substrate 10, and the light-emitting element layer 14 disposed on the circuit layer 12. The polarizing plate 18 may be disposed on the light-emitting element layer 14, and the cover glass 20 may be disposed on the polarizing plate 18.

In the polarizing plate 18, a first light-transmitting pattern 18*d* may be formed in an area corresponding to the light-transmitting area TA. Based on green light having a wavelength of 555 nm, a light transmittance of the substrate made of P1 is about 70% to 80%, and a light transmittance of the cathode is 80% to 90%. On the other hand, a light transmittance of the polarizing plate 18 is relatively very low to about 40%. Thus, in order to effectively increase the light transmittance in the light-transmitting area, it is beneficial to increase the light transmittance of the polarizing plate 18.

The polarizing plate 18 according to the embodiment may have the first light-transmitting pattern 18*d* formed above the light-transmitting area TA to improve light transmittance. The light transmittance of the area in which the first light-transmitting pattern is formed may be the highest in the polarizing plate. Thus, the amount of light introduced into the image capturing unit 40 in the light-transmitting area increases, thereby improving performance.

The first light-transmitting pattern 18*d* of the polarizing plate 18 may be formed by removing a portion of the polarizing plate 18 and may also be formed by decomposing a compound constituting the polarizing plate 18. That is, the first light-transmitting pattern 18*d* may have various structures capable of increasing the light transmittance of the conventional polarizing plate 18.

In the light-transmitting area TA, the polarizing plate 18 may have the first light-transmitting pattern 18*d*, and a cathode CAT may have a second light-transmitting pattern. The second light-transmitting pattern may be an opening H1 formed in the light-transmitting area TA. Since the light transmittance of the cathode is 80% to 90%, the light transmittance of the light-transmitting area TA may be further increased due to the opening H1.

A method of forming the opening H1 in the cathode CAT is not particularly limited. As an example, after the cathode is formed, the opening H1 may be formed in the cathode using an etching process, or the cathode may be removed using a laser at a lower portion of the substrate 10.

A planarization layer PCL may be formed on the cathode CAT, and a touch sensor TOE may be disposed on the planarization layer PCL. Here, in the light-transmitting area TA, a sensing electrode and lines of the touch sensor may be made of a transparent material such as indium tin oxide (ITO) or a metal mesh, thereby increasing light transmittance.

Figure 6:
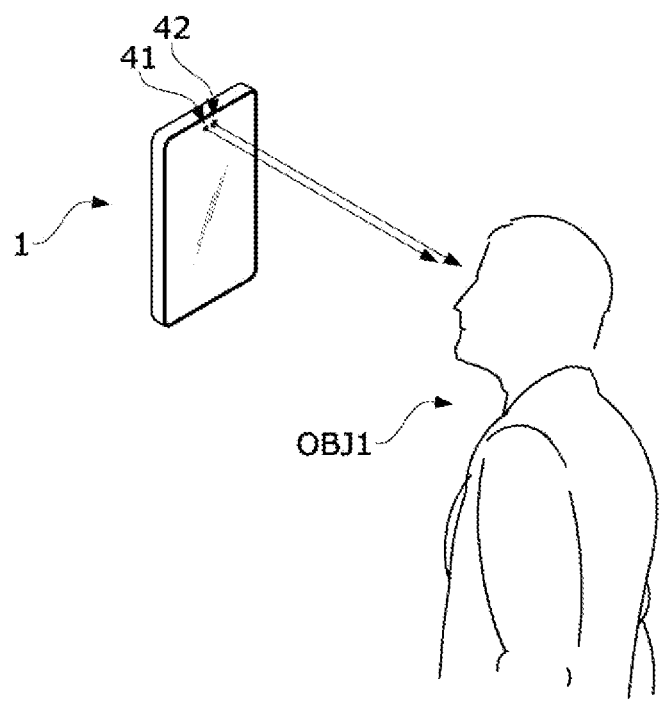
FIG. 6 is a view illustrating a state in which an image of a user is captured.
Figure 7:
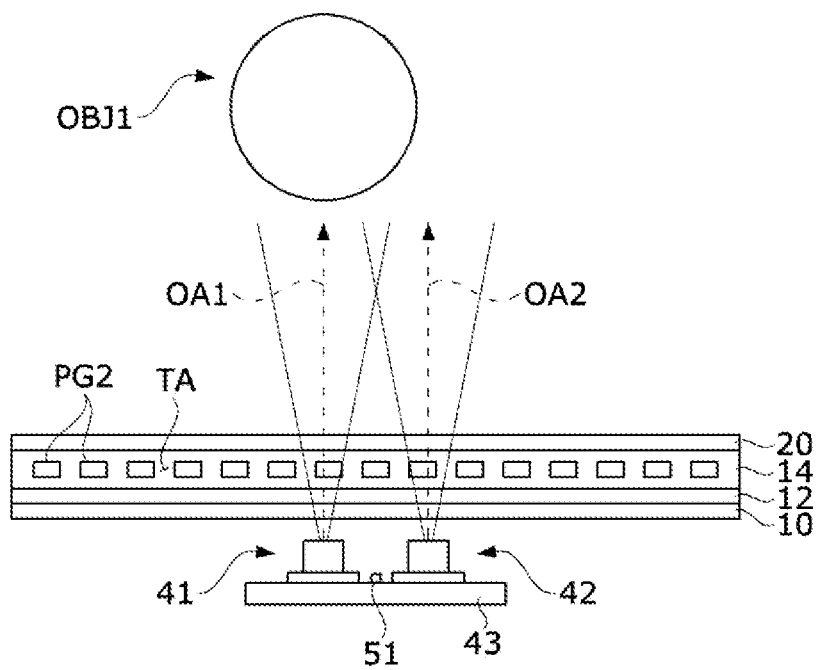
FIG. 7 is a view illustrating a first image capturing unit and a second image capturing unit disposed on a rear side of a display panel.
Figure 8A:
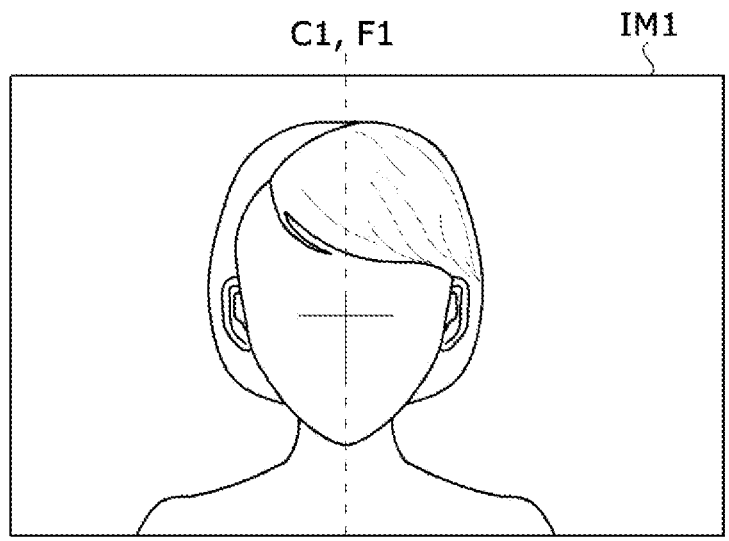
FIG. 8A is a view illustrating a first image acquired by the first image capturing unit.
Figure 8B:
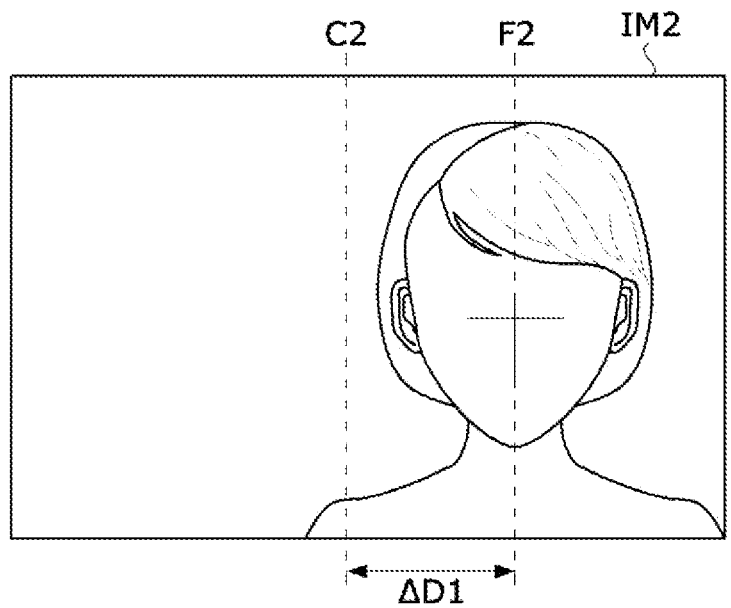
FIG. 8B is a view illustrating a second image acquired by the second image capturing unit.
Figure 9:
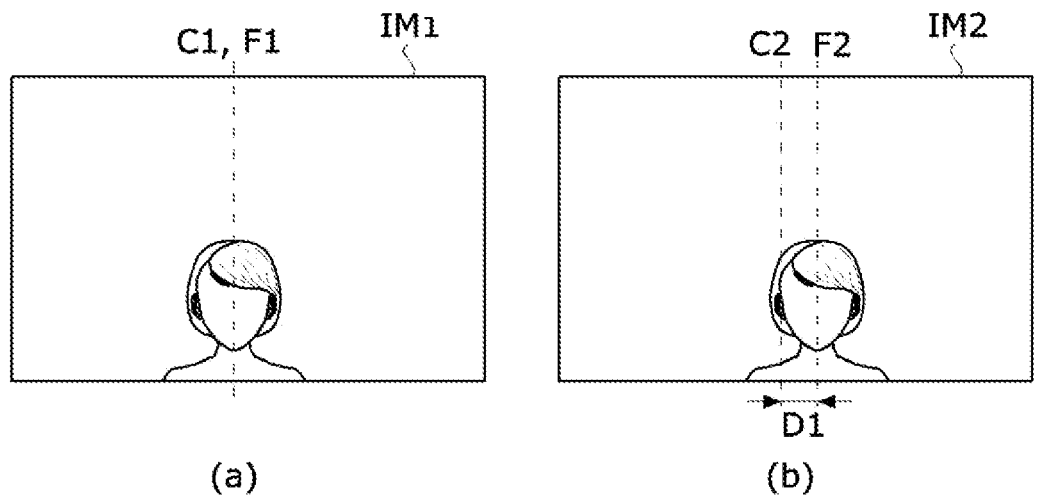
FIGS. 9 to 11 show first images acquired by the first image capturing unit and second images acquired by the second image capturing unit while reducing a distance to an object.
Figure 10:
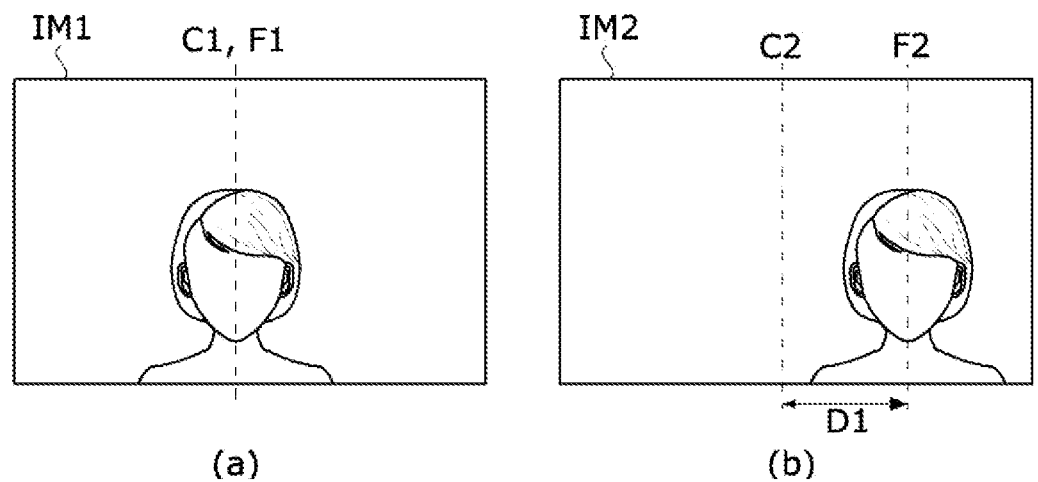
Figure 11:
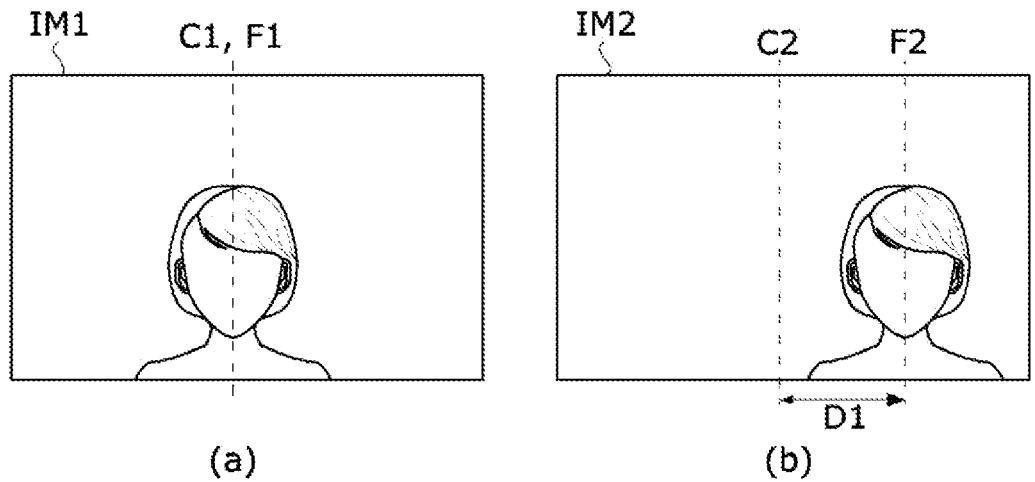

FIG. 6 is a view illustrating a state in which an image of a user is captured. FIG. 7 is a view illustrating a first image capturing unit and a second image capturing unit disposed on a rear side of a display panel. FIG. 8A is a view illustrating a first image acquired by the first image capturing unit. FIG. 8B is a view illustrating a second image acquired by the second image capturing unit. FIGS. 9 to 11 show first images acquired by the first image capturing unit and second images acquired by the second image capturing unit while reducing a distance to an object.

Referring to FIGS. 6 and 7, the user may capture a front image by operating a display device 1. As an example, the user may operate a camera operation button displayed on the display panel. At this point, a plurality of image capturing units 41 and 42 may be disposed on a front surface of the display device to capture an image in front of the display device. In the following description, the image capturing units 41 and 42 are described as being two, but the number of image capturing units is not particularly limited.

A first image capturing unit 41 and a second image capturing unit 42 may be disposed in a second display area. The first image capturing unit 41 may be disposed at a center of an upper end of the display panel, and the second image capturing unit 42 may be disposed around the first image capturing unit 41. However, the positions of the first image capturing unit 41 and the second image capturing unit 42 are not necessarily limited thereto, and the first image capturing unit 41 and the second image capturing unit 42 may be disposed at various positions in the second display area.

The first image capturing unit 41 may be a main image capturing unit that acquires a reference image and the second image capturing unit 42 may be a sub-image capturing unit that additionally acquires an image to supplement the reference image.

The first image capturing unit 41 and the second image capturing unit 42 may each be a camera module including a plurality of lenses and/or an image sensor. The camera module may include a circuit board, an image sensor, a case, an actuator, and a plurality of lenses. However, the present disclosure is not necessarily limited thereto, and various image acquisition devices capable of performing the role of a camera may be selected.

According to the embodiment, one picture or video image data may be generated using two image capturing units. Since a plurality of pixels are disposed in the second display area, the amount of light incident on the image capturing unit may not be sufficient. Thus, image quality may be poor since data of light injected into the image capturing unit is not sufficient.

Accordingly, in the embodiment, a plurality of image capturing units are disposed to additionally acquire light data, and the first image acquired by the first image capturing unit 41 and the second image acquired by the second image capturing unit 42 may be synthesized so that a high-quality image may be realized.

In an initial state, an optical axis OA1 of the first image capturing unit 41 and an optical axis OA2 of the second image capturing unit 42 may be set to be parallel. However, in the case in which the optical axes OA1 and OA2 of the first image capturing unit 41 and the second image capturing unit 42 are parallel, when an object OBJ1 is relatively close to the display device, a disparity may occur between the first image acquired by the first image capturing unit 41 and the second image acquired by the second image capturing unit 42.

Here, the disparity may be a difference between positions in which the object OBJ1 is disposed in images. The object OBJ1 may be a portrait image in the image, but is not necessarily limited thereto, and may be a region of interest (ROI) to be captured by the user.

Referring to FIG. 8A, a position F1 of the object OBJ1 in a first image IM1 acquired by the first image capturing unit may be disposed in a center C1 of the image. However, referring to FIG. 8B, it can be seen that a position F2 of the object OBJ1 in a second image IM2 acquired by the second image capturing unit is deviated to a right side from a center C2. That is, a disparity ΔD1 occurs in the first image IM1 acquired by the first image capturing unit and the second image IM2 acquired by the second image capturing unit 42. This problem may occur when two image capturing units are disposed to be spaced apart from each other while optical axes are parallel to each other.

Referring to FIG. 9, when the object is sufficiently far away from the display device, a difference (disparity) ΔD1 between points at which the object is positioned in the first image IM1 and the second image IM2 may not be large. Thus, it can be said that the disparity between the first image IM1 and the second image IM2 is small.

However, when the object approaches the display device as shown in FIG. 10, the points at which the object is positioned in the first image IM1 and the second image IM2 may be different. That is, as the object is closer to the display device, the disparity ΔD1 between the first image IM1 and the second image IM2 may occur to a greater extent.

In a case in which the object is very close to the display device as shown in FIG. 11, the points at which the object is positioned in the first image IM1 and the second image IM2 may be greatly different. In the second image IM2, a portion of the object may not be visible.

As described above, when both the first image capturing unit 41 and the second image capturing unit 42 face the front, a disparity occurs according to the distance to the object OBJ1, and thus a correction is beneficial so that the position of the object OBJ1 in the first image IM1 matches the position of the object OBJ1 in the second image IM2. Thus, there is a problem in that the amount of calculation for the position correction is increased and a data processing speed is reduced.

In particular, in a case of close-up image capturing, the disparity occurs greatly, and thus the second image capturing unit 42 may acquire only a portion of a face image or may not acquire the face image at all. Thus, the quality of the image may not be improved even when a plurality of images are synthesized because sufficient light data may not be collected.

Figure 12:
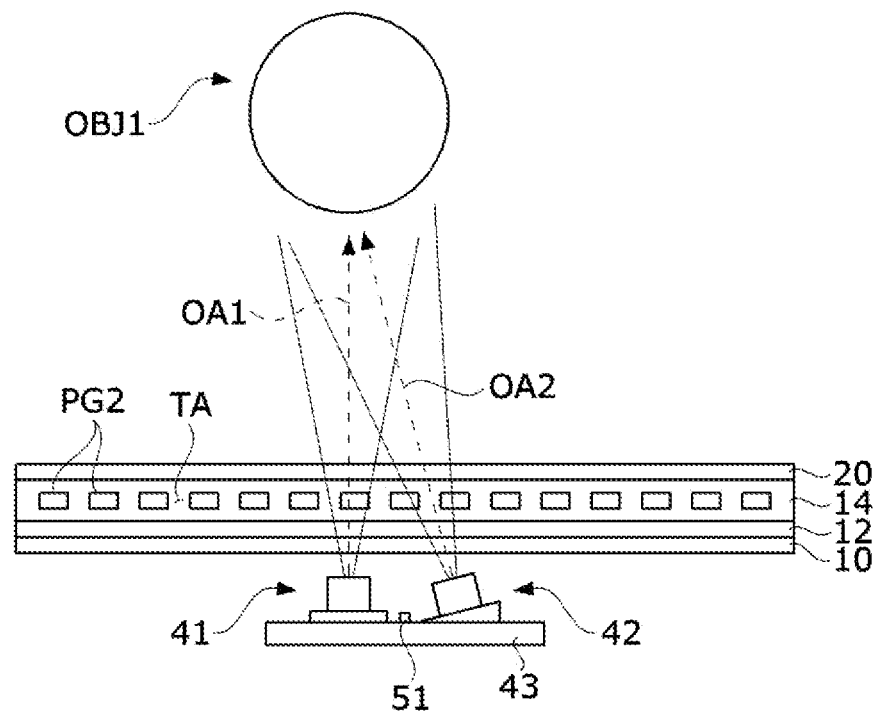
FIG. 12 is a view illustrating a state in which the second image capturing unit rotates.
Figure 13A:
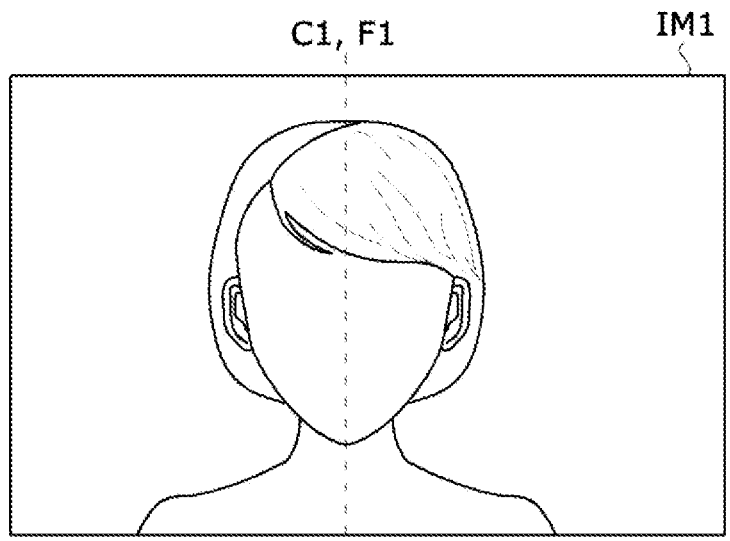
FIG. 13A a view illustrating a first image acquired by the first image capturing unit.
Figure 13B:
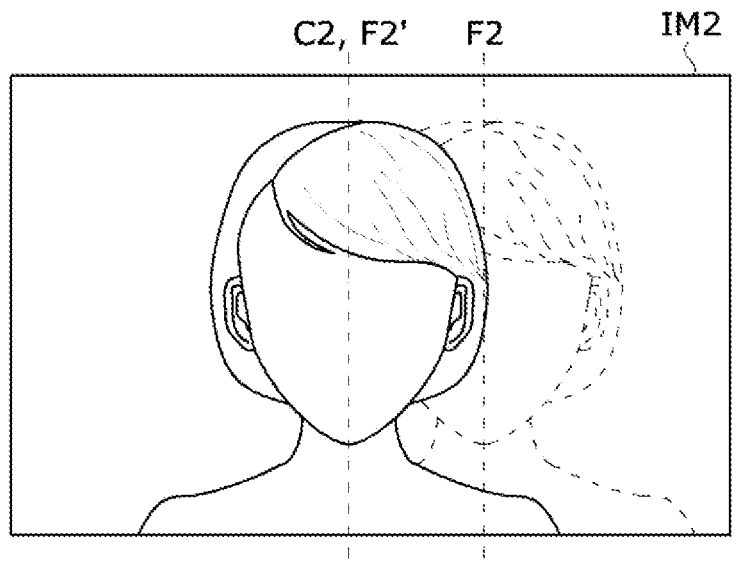
FIG. 13B a view illustrating a second image acquired by the rotated second image capturing unit.
Figure 14:
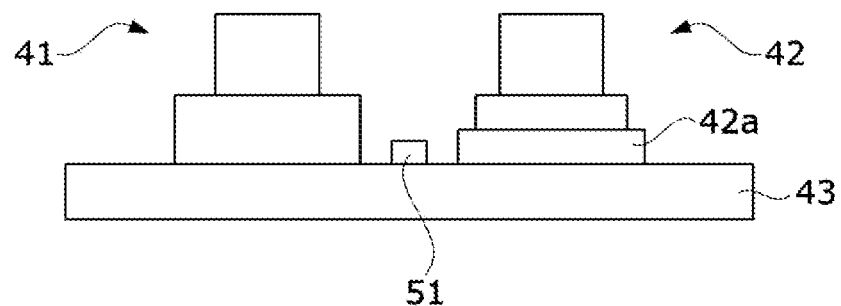
FIG. 14 is a view illustrating the first image capturing unit and the second image capturing unit.
Figure 15:
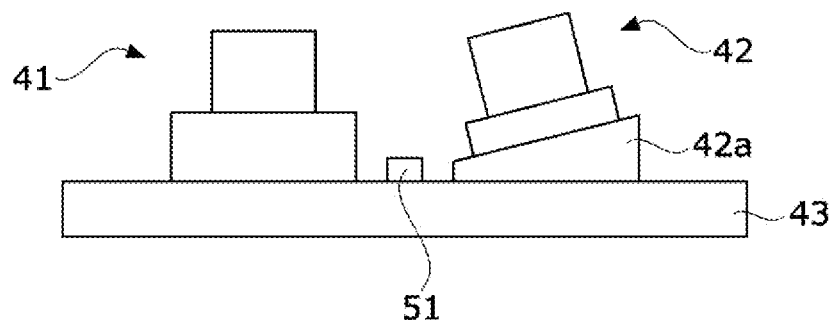
FIG. 15 is a view illustrating a state in which the second image capturing unit rotates.
Figure 16:
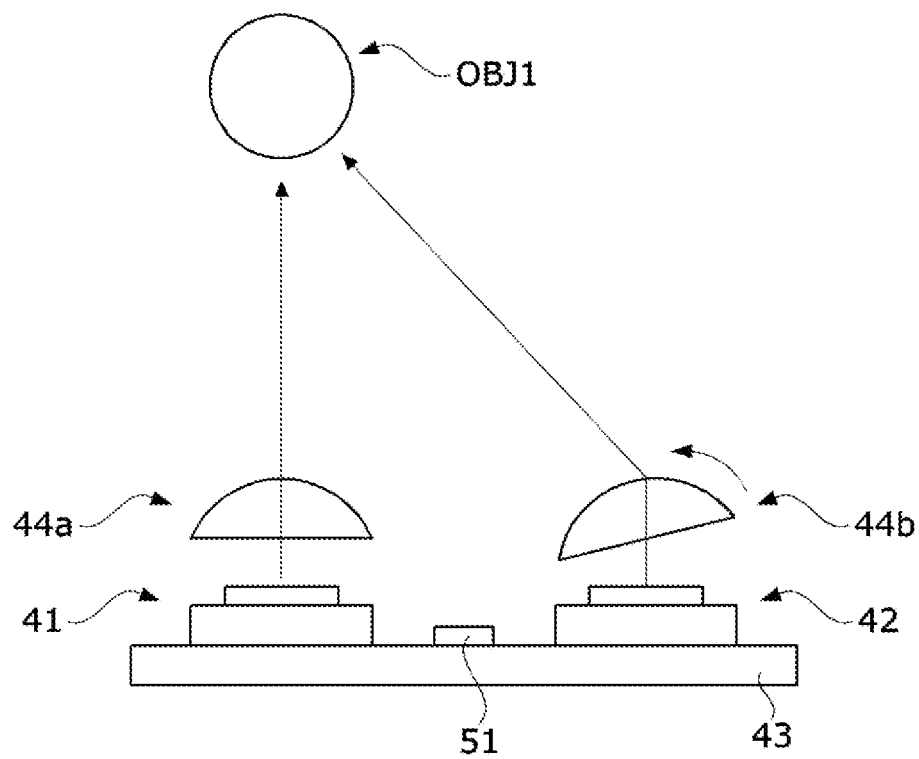
FIG. 16 is a modified example of FIG. 14.
Figure 17:
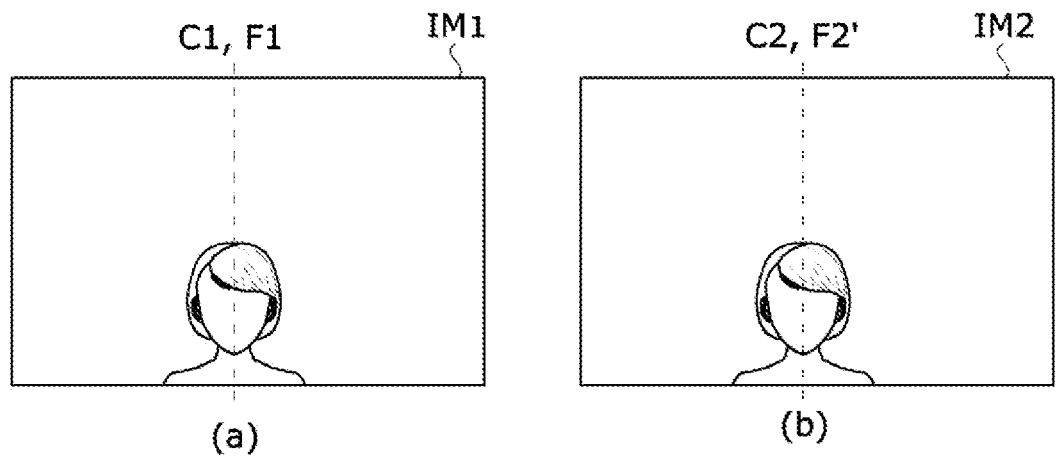
FIGS. 17 to 19 show first images acquired by the first image capturing unit and second images acquired by the second image capturing unit while reducing a distance to an object.
Figure 18:
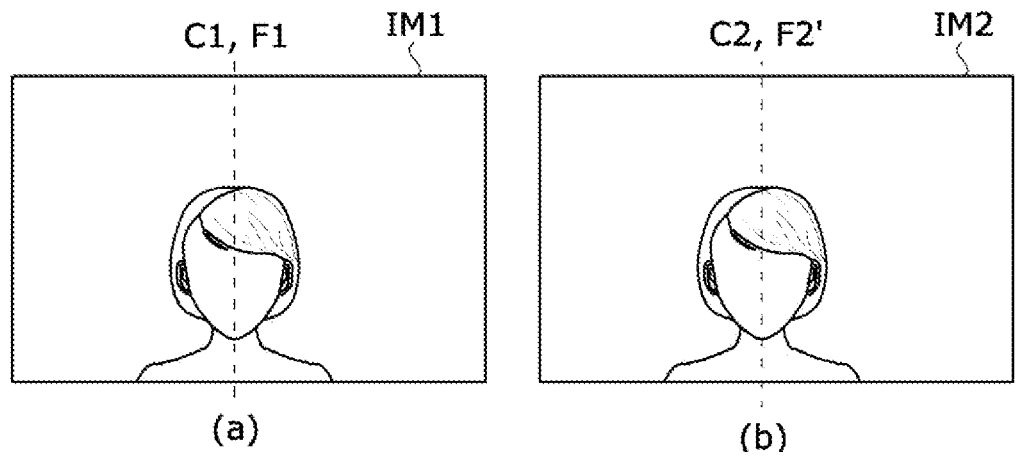
Figure 19:
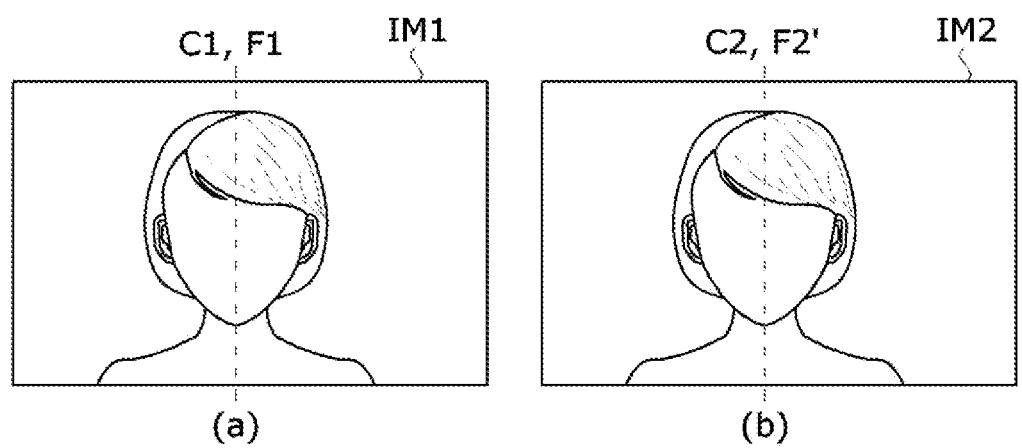

FIG. 12 is a view illustrating a state in which the second image capturing unit rotates. FIG. 13A a view illustrating a first image acquired by the first image capturing unit. FIG. 13B a view illustrating a second image acquired by the rotated second image capturing unit. FIG. 14 is a view illustrating the first image capturing unit and the second image capturing unit. FIG. 15 is a view illustrating a state in which the second image capturing unit rotates. FIG. 16 is a modified example of FIG. 14. FIGS. 17 to 19 show first images acquired by the first image capturing unit and second images acquired by the second image capturing unit obtained while reducing a distance to an object.

Referring to FIG. 12, the display device according to the embodiment may measure a distance to the object OBJ1 using a distance sensor 51, and then rotate the second image capturing unit 42 toward the object OBJ1. In the embodiment, it is illustrated that the optical axis OA2 of the second image capturing unit 42 rotates, but the present disclosure is not necessarily limited thereto, and a variety of methods capable of controlling the second image capturing unit 42 to acquire an image of the object OBJ1 may be applied without limitation. As shown in FIG. 12, following rotation of the second image capturing unit 42 toward the object OBJ1, the optical axis OA2 intersects (i.e., crosses or is transverse) the optical axis OA1.

Referring to FIG. 13A, a position F1 of the object OBJ1 in a first image IM1 may be disposed at a center C1, and referring to FIG. 13B, a position F2' of the object OBJ1 in a second image IM2 may also be disposed in a center C2 by rotating the second image capturing unit 42 toward the object OBJ1. Thus, a disparity in the first image IM1 and the second image IM2 may be removed.

Referring to FIGS. 14 and 15, the first image capturing unit 41, the second image capturing unit 42, and the distance sensor 51 may be disposed on a first substrate 43. However, the distance sensor 51 may also be disposed on a separate substrate other than the first substrate.

The type of the distance sensor 51 is not particularly limited. The distance sensor 51 may include a transmitter and a receiver that allow the distance of the object OBJ1 to be measured. As an example, the distance sensor 51 may include a laser transmitter and a laser receiver.

The second image capturing unit 42 may include a rotating unit 42a. The rotating unit 42a may be an actuator that rotates the second image capturing unit 42. The configuration for rotating the second image capturing unit 42 is not particularly limited. As an example, the rotating unit 42a may rotate the second image capturing unit 42 itself and selectively rotate the lens and/or image sensor constituting the second image capturing unit 42.

A rotation angle of the second image capturing unit 42 may be pre-stored in a memory in the form of a look-up table (LUT) according to the distance to the object OBJ1. Thus, when the distance information of the object OBJ1 is acquired by the distance sensor 51, a processor of the display device may use information on the rotation angle stored in the look-up table to rotate the second image capturing unit 42.

Referring to FIG. 16, the rotating unit may include a light path adjustment module 44b disposed on an upper portion of the second image capturing unit 42. The rotating unit may include various light path adjustment modules capable of changing a path of light incident on the second image capturing unit 42. The light path adjustment module may include a lens and an actuator. In addition, a light path adjustment module 44a may be disposed on an upper portion of the first image capturing unit 41 to adjust a path of light incident on the first image capturing unit 41.

According to the embodiment, the second image capturing unit 42 may not move and finely drive the light path adjustment module to acquire an image of the object OBJ1. At this point, the first image capturing unit 41 and the second image capturing unit 42 may use the same camera module.

Referring to FIG. 17, when the object OBJ1 is relatively far away from the display device, the rotation angle of the second image capturing unit 42 may not be large. However, as shown in FIGS. 18 and 19, the rotation angle of the second image capturing unit 42 may be increased as the object OBJ1 becomes closer to the display device. As a result, even when the object OBJ1 is disposed close to the display device, the position F1 of the object OBJ1 in the first image IM1 and the position F2' of the object OBJ1 in the second image IM2 may be substantially equal to each other.

According to the embodiment, since the second image capturing unit 42 rotates according to the distance of the object OBJ1, the position of the object OBJ1 in the first image IM1 and the position of the object OBJ1 in the second image IM2 may be equal to each other. Thus, a separate position correction calculation may be omitted so that a calculation amount may be reduced and a processing speed may be improved. In addition, since the entire face is captured in the second image IM2 even during close-up image capturing, information on face image data may be increased. Thus, the quality of a portrait picture may be improved by synthesizing a plurality of images.

Figure 20:
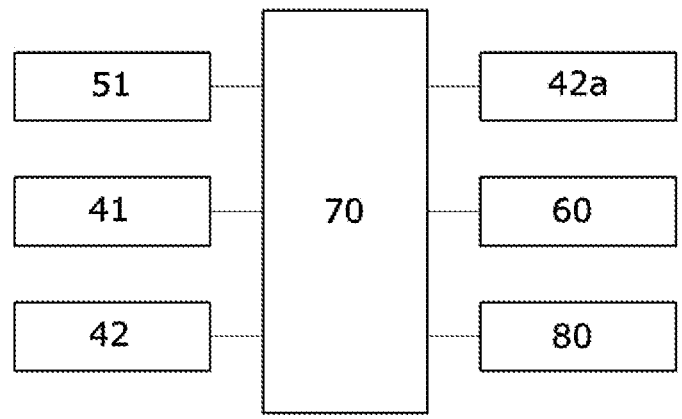
FIG. 20 is a block diagram of a display device.
Figure 21:
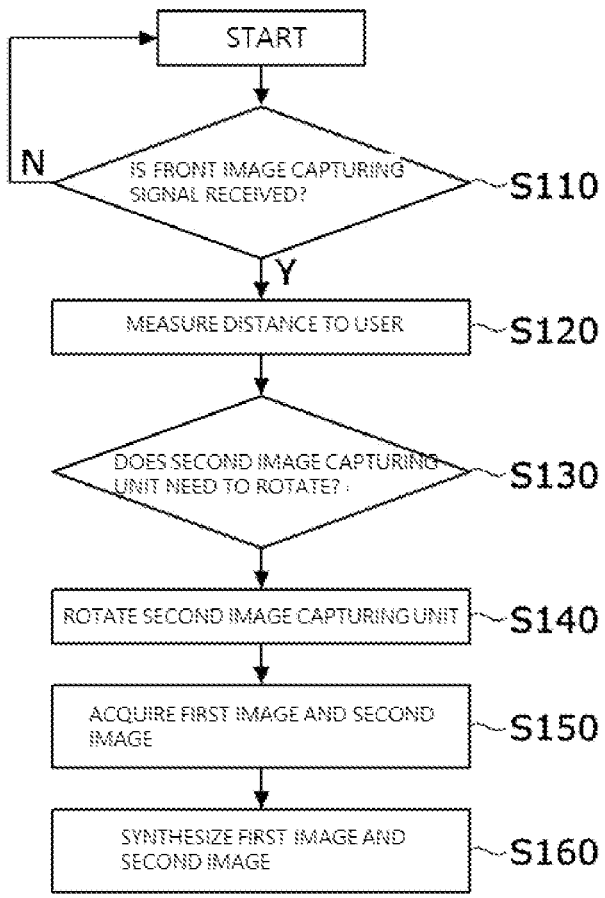
FIG. 21 is a flowchart illustrating a method of synthesizing images according to one embodiment of the present disclosure.

FIG. 20 is a block diagram of a display device. FIG. 21 is a flowchart illustrating a method of synthesizing images according to one embodiment of the present disclosure.

Referring to FIGS. 20 and 21, the display device may include a distance sensor 51, a first image capturing unit 41, a second image capturing unit 42, a rotating unit 42a, a touch module 60, a memory 80, and a processor 70 that controls the above components. The processor 70 may typically control the operation of each unit to control the overall operation of the display device.

When a user touches an operation button displayed on the display panel for selfie image-capturing, the processor 70 may receive a front image capturing signal (S110).

The processor 70 may drive the distance sensor 51 to acquire distance information of the object OBJ1 (S120).

Thereafter, the processor 70 may detect a rotation angle according to the distance and determine whether the second image capturing unit 42 needs to be rotated (S130), and may rotate the second image capturing unit 42 with a predetermined or selected angle when it is determined that the second image capturing unit 42 needs to be rotated (S140).

The processor 70 may acquire images using the first image capturing unit 41 and the second image capturing unit 42, and synthesize the images to generate an image with improved image quality (S150 and S160).

Figure 22:
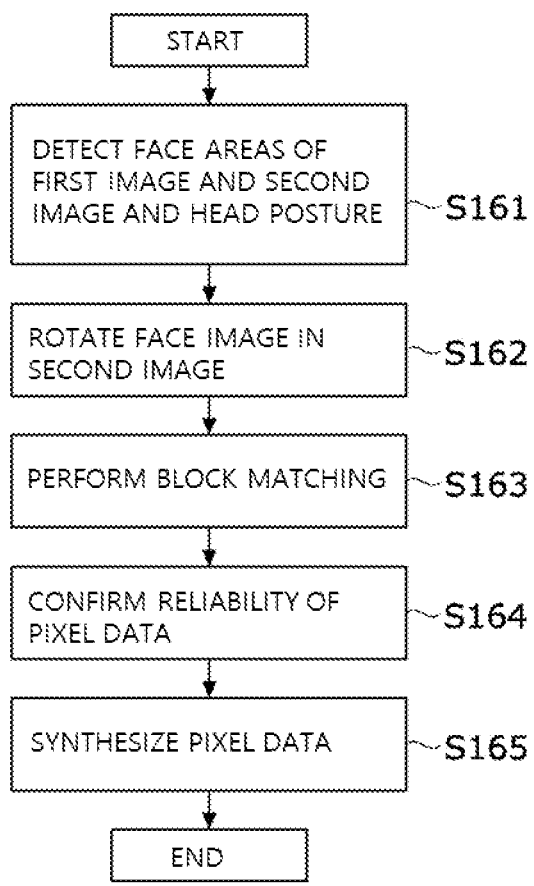
FIG. 22 is a flowchart illustrating a process of synthesizing a first image and a second image.
Figure 23:
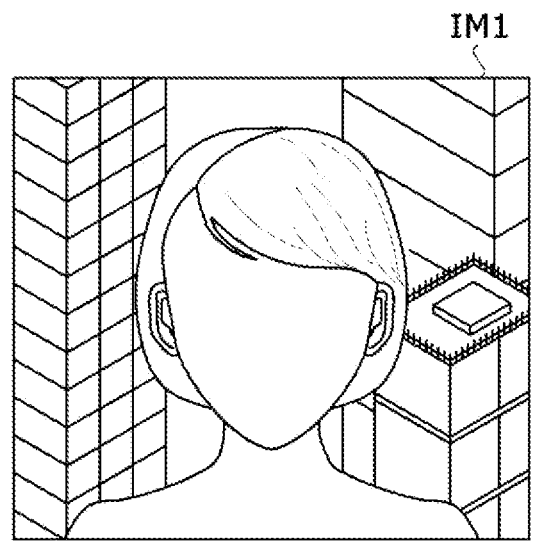
FIG. 23 shows the first image acquired by the first image capturing unit.
Figure 24:
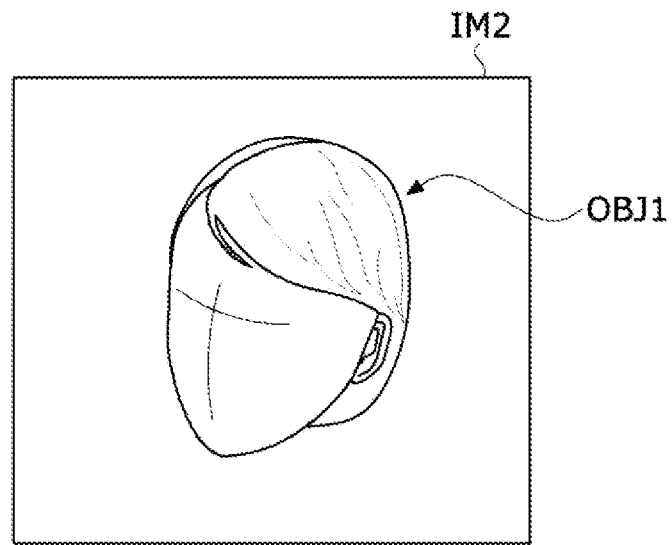
FIG. 24 is a view obtained by extracting only a face image from the second image acquired by the second image capturing unit.
Figure 25:
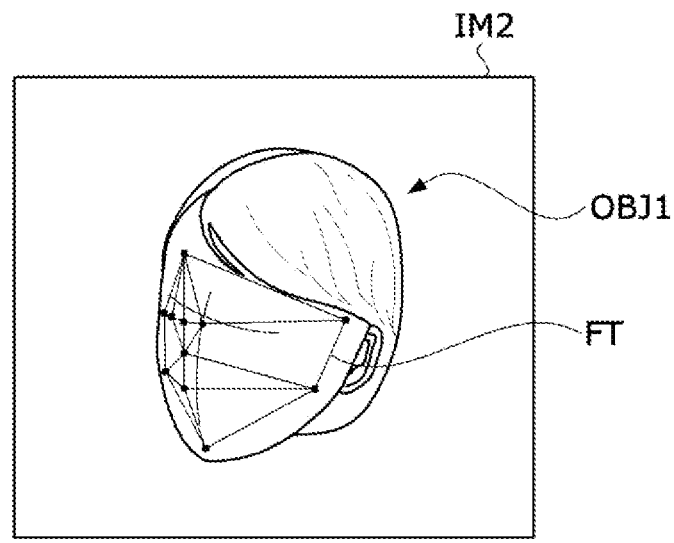
FIG. 25 is a view illustrating a state in which feature points of the face image are extracted.
Figure 26:
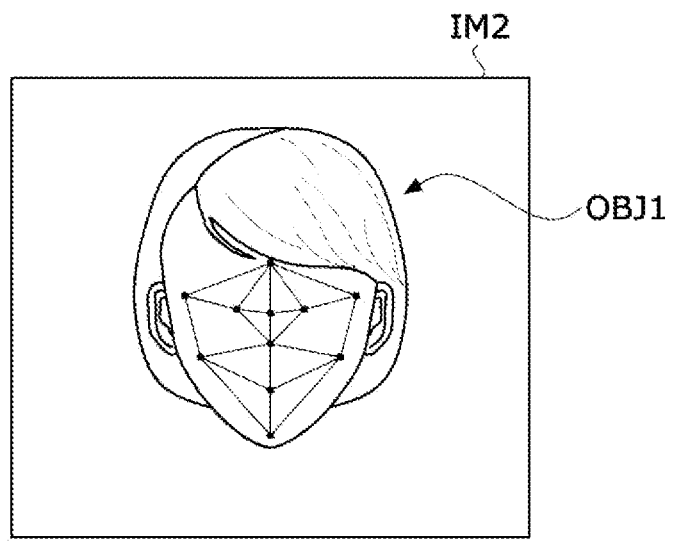
FIG. 26 is a view illustrating a state in which the face image rotates.

FIG. 22 is a flowchart illustrating a process of synthesizing a first image and a second image. FIG. 23 shows the first image acquired by the first image capturing unit. FIG. 24 is a view obtained by extracting only a face image from the second image acquired by the second image capturing unit. FIG. 25 is a view illustrating a state in which feature points of the face image are extracted. FIG. 26 is a view illustrating a state in which the face image rotates.

Referring to FIG. 22, a synthesized image generating operation may include a face detecting operation (S161), a face rotating operation (S162), a block matching operation (S163), a reliability confirming operation (S164), and a synthesizing operation (S165).

In the face detecting operation (S161), as shown in FIG. 23, a face area may be detected from a first image IM1 and a head posture may be estimated. The face image in the first image IM1 may be a front face image. However, the present disclosure is not necessarily limited thereto, and the face image in the first image IM1 may not be the front face image depending on the distance to the object. As an example, the face image in the first image IM1 may be a side face image.

Referring to FIG. 24, a face area is detected from a second image IM2, and a head posture may be estimated. At this point, only the face area may be extracted from the second image IM2. A technique of detecting and extracting the face from the image, and a technique of detecting the head posture may be implemented using various image processing techniques.

As an example, the technique of detecting the face may use an Adaboost algorithm using Haar features, and the technique of detecting the head posture may use an active appearance model (AAM) for extracting feature points and a Pose from Orthography and Scaling with Iterations (POSIT) algorithm.

Since the second image IM2 is an image acquired by rotating the second image capturing unit 42 toward the object OBJ1, a portrait image in the first image IM1 and a portrait image in the second image IM2 may be different. As an example, the portrait image in the first image IM1 may be a front face image as shown in FIG. 23, but the portrait image in the second image IM2 may be a side face image as shown in FIG. 24.

Accordingly, in the embodiment, a head posture of the object OBJ1 may be estimated from the first image IM1 and a head posture of the object OBJ1 may be estimated from the second image IM2, and the face image in the second image IM2 may be rotated on the basis of the estimated head postures and may be matched with the face image in the first image IM1. For example, the side face image in the second image IM2 may be rotated to be corrected to a front face image such as the first image IM1. When it is determined that both the first image IM1 and the second image IM2 are the front face images, such correction may be omitted.

Referring to FIGS. 25 and 26, a plurality of feature points are extracted from the face image in the second image IM2, and then the face image is rotated on the basis of the extracted feature points to obtain a face image of the same angle in the two images.

According to such a configuration, the face image in the second image is matched with the face image in the first image IM1 by rotating the face image in the second image so that block matching is easily performed in the face image in the first image IM1 and the face image in the second image IM2, thereby improving data reliability.

As an example, a K-nearest neighbors (KNN) algorithm or a blend shape algorithm may be used as a method used to generate a reference feature point and a virtual feature point.

In the block matching operation, correlation with a reference block may be calculated for each search target block. The reference block may be pixels of the face image in the first image IM1, and the search target block may be pixels of the face image in the second image IM2.

The correlation may indicate a similarity between the search target block and the reference block. For example, the correlation may be obtained by calculating a cross-correlation value and/or a sum of absolute difference (SAD) value between the search target block and the reference block. In the embodiment, only the face image may be extracted from the second image IM2 so that the calculation amount may be reduced.

When the correlation is obtained for all the search target blocks, the processor may determine a search target pixel that exists in a center of the search target block having a highest correlation value as a matching pixel for a reference pixel. Through this process, pixels of the face image in the first image IM1 may be matched with pixels of the face image in the second image IM2.

In the reliability confirming operation, for each pixel for implementing an image, pixel data having higher reliability may be selected from among pixel data of the first image IM1 and pixel data of the second image IM2. This process may be repeated in all the pixels for implementing the face image. Thus, an image quality may be improved since the face image is generated by selecting only excellent pixels among the pixels of the first image IM1 and the pixels of the second image IM2.

Since the first image capturing unit 41 and the second image capturing unit 42 are covered by the pixels of the second display area and thus may not receive sufficient light data, the first image IM1 and the second image IM2 may be incomplete in some areas. Thus, the image quality may be improved by supplementing insufficient pixel data in the first image IM1 with the pixel data of the second image IM2.

Figure 27:
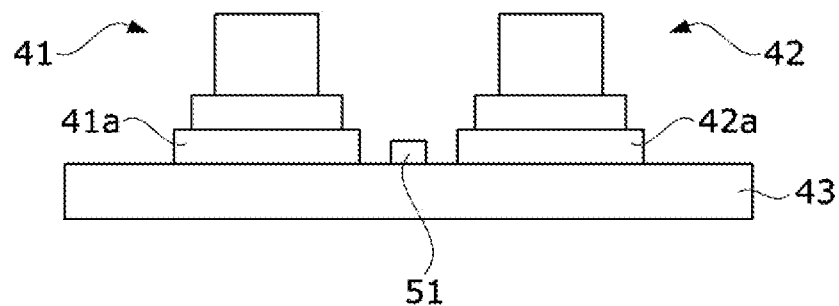
FIG. 27 is a view illustrating a first image capturing unit and a second image capturing unit of a display device according to another embodiment of the present disclosure.
Figure 28:
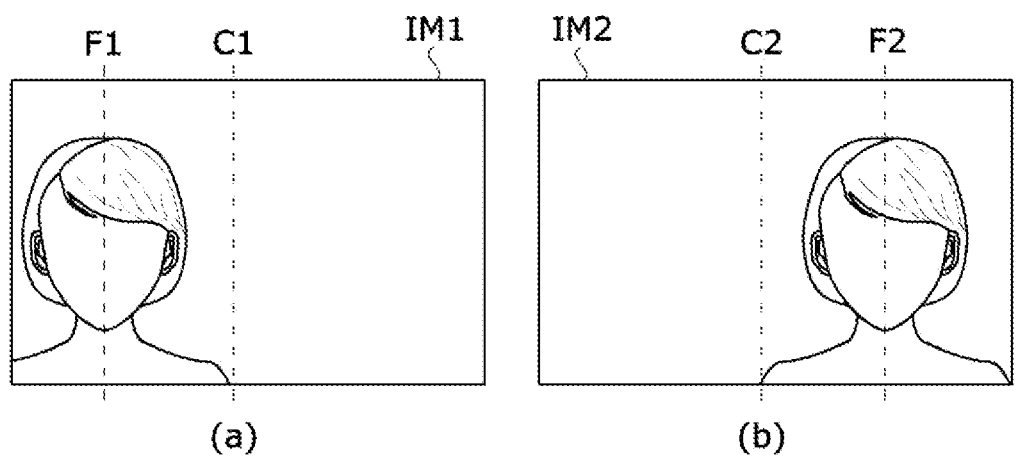
FIG. 28 is a view illustrating a state in which a disparity between a face image in a first image and a face image in a second image is large.
Figure 29:
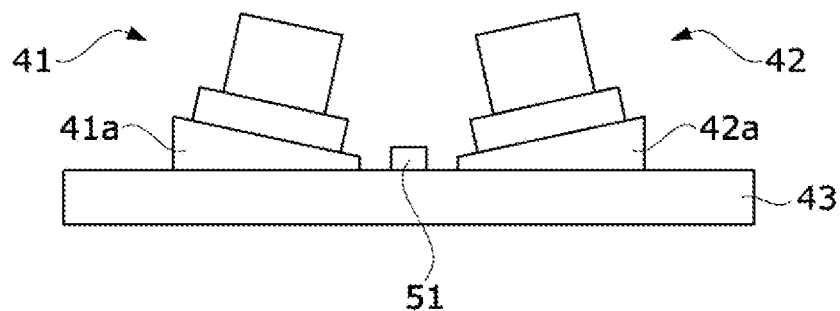
FIG. 29 is a view illustrating a state in which the first image capturing unit and the second image capturing unit rotate.
Figure 30:
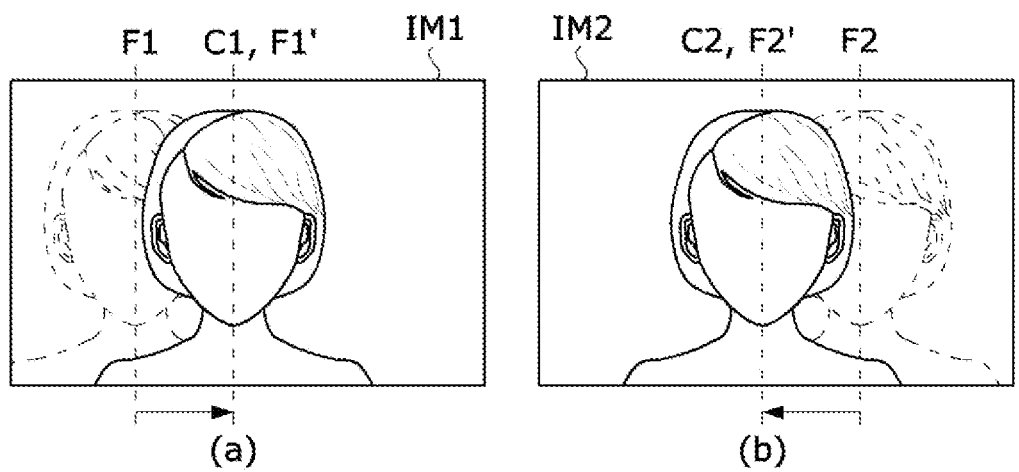
FIG. 30 is a view illustrating a state in which positions of the face image in the first image and the face image in the second image are aligned.

FIG. 27 is a view illustrating a first image capturing unit and a second image capturing unit of a display device according to another embodiment of the present disclosure. FIG. 28 is a view illustrating a state in which a disparity between a face image in a first image and a face image in a second image is large. FIG. 29 is a view illustrating a state in which the first image capturing unit and the second image capturing unit rotate. FIG. 30 is a view illustrating a state in which positions of the face image in the first image and the face image in the second image are aligned.

Referring to FIG. 27, the display device according to the embodiment may include a first rotating unit 41a configured to rotate a first image capturing unit 41 and a second rotating unit 42a configured to rotate a second image capturing unit 42. The first rotating unit 41a and the second rotating unit 42a may each have the same configuration as the rotating unit described above.

According to the embodiment, the first image capturing unit 41 may be rotated independently by the first rotating unit 41a, and the second image capturing unit 42 may be rotated independently by the second rotating unit 42a.

This configuration has an advantage in that an optimal image may be acquired by individually rotating the first image capturing unit 41 and the second image capturing unit 42 during close-up image capturing.

As shown in FIG. 28, when positions F1 and F2 of face images in both a first image IM1 and a second image IM2 are not centers C1 and C2 of the images, respectively, images may be acquired by rotating both the first image capturing unit 41 and the second image capturing unit 42.

When a portrait image in the first image IM1 acquired through the first image capturing unit 41 is positioned to be deviated from a predetermined or selected position in the center C1 of the first image IM1, a processor may control the first image capturing unit 41 to rotate to acquire an image again. In addition, when a portrait image in the second image IM2 acquired through the second image capturing unit 42 is also positioned to be deviated from a predetermined or selected position in the center C2 of the second image IM2, the processor may control to acquire an image again.

In this case, as shown in FIG. 30, in the first image IM1 and the second image IM2, positions F1' and F2' of the face images may be disposed at the centers C1 and C2 of the images. In addition, as described above, the images may be synthesized after block matching is performed.

Figure 31:
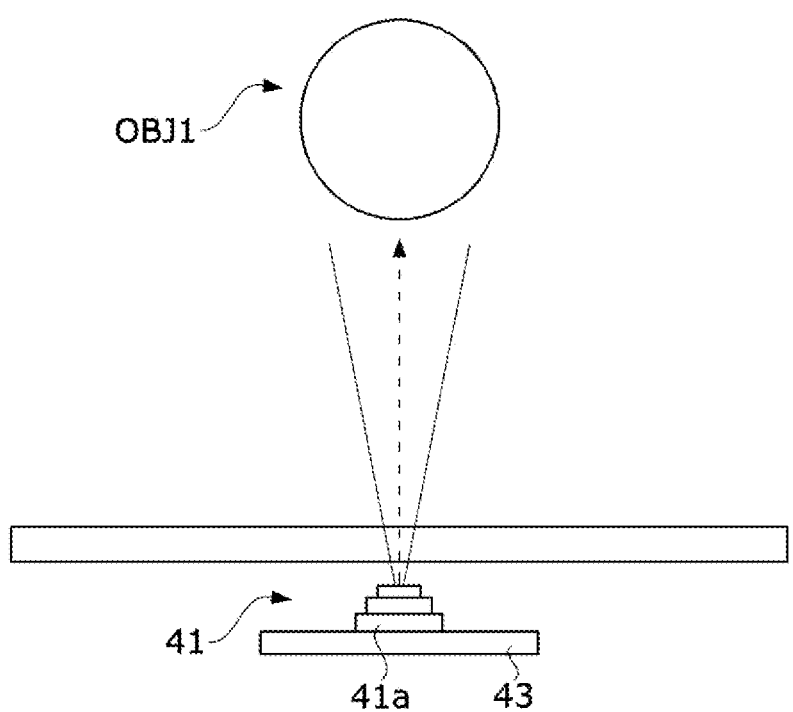
FIG. 31 is a view illustrating an image capturing unit of a display device according to still another embodiment of the present disclosure.
Figure 32A:
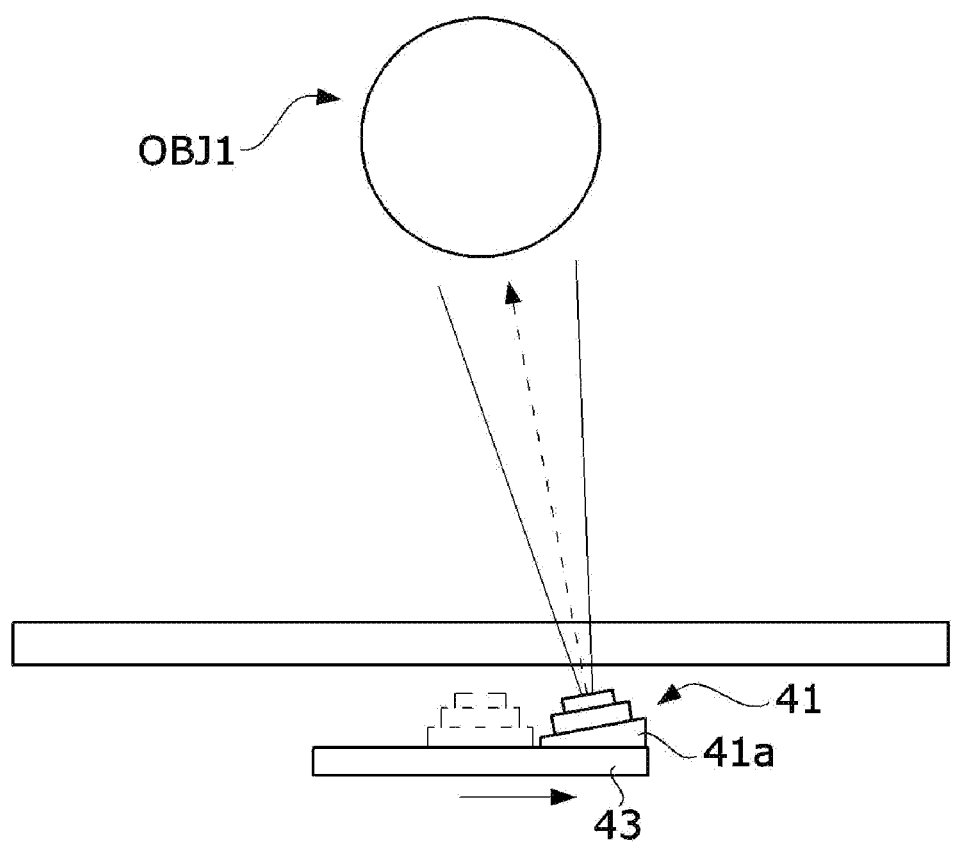
FIG. 32A is a view illustrating a state in which the image capturing unit moves in a first direction and rotates.
Figure 32B:
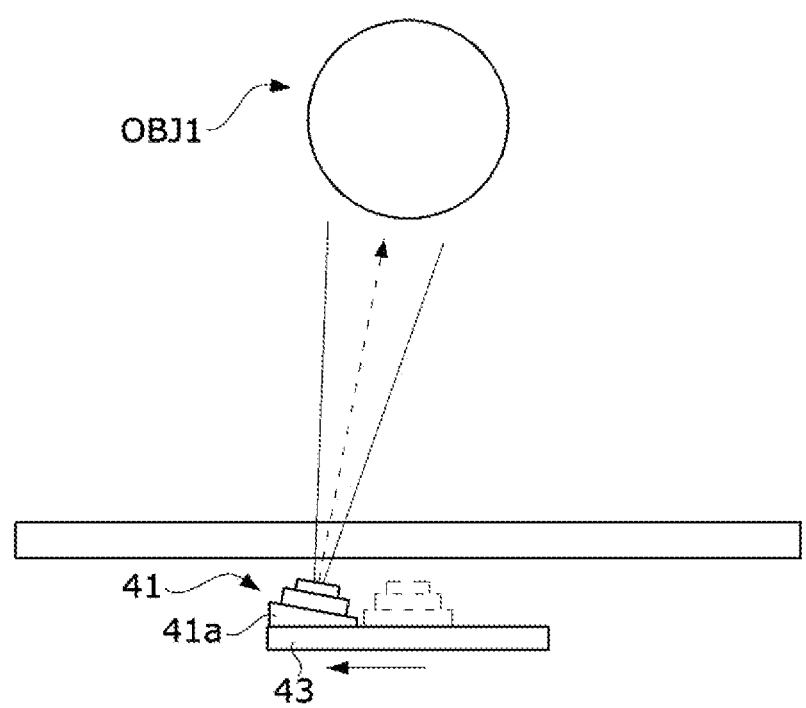
FIG. 32B is a view illustrating a state in which the image capturing unit moves in a second direction and rotates.
Figure 33A:
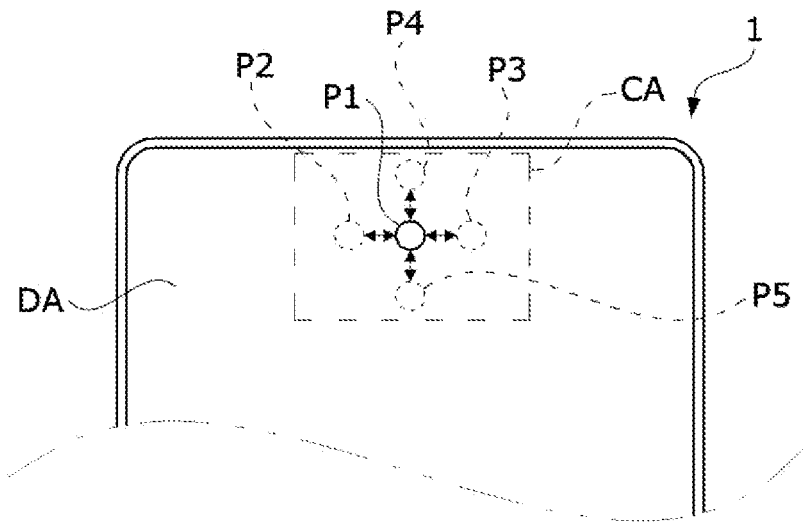
FIG. 33A is a view illustrating a state in which one image capturing unit moves to various points and acquires images.
Figure 33B:
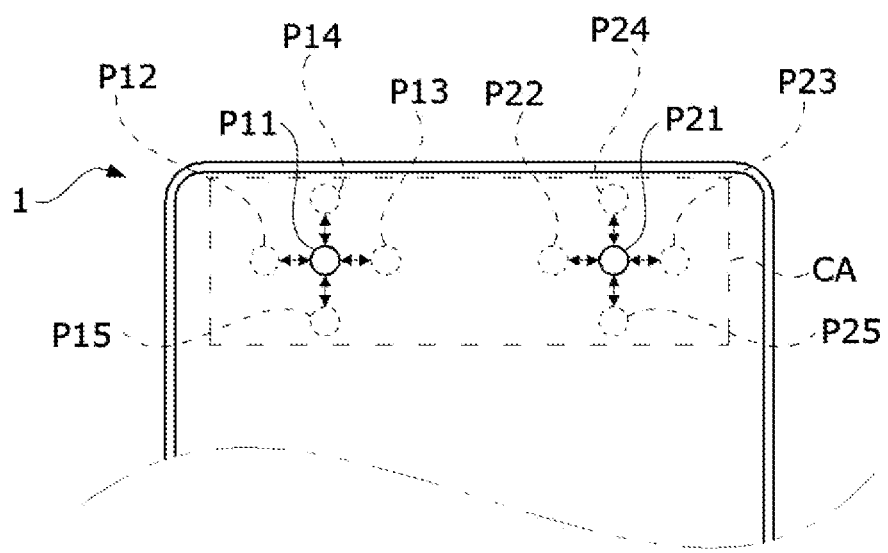
FIG. 33B is a view illustrating a state in which a plurality of image capturing units move to various points and acquire images.

FIG. 31 is a view illustrating an image capturing unit of a display device according to still another embodiment of the present disclosure. FIG. 32A is a view illustrating a state in which the image capturing unit moves in a first direction and rotates. FIG. 32B is a view illustrating a state in which the image capturing unit moves in a second direction and rotates. FIG. 33A is a view illustrating a state in which one image capturing unit moves to various points and acquires images. FIG. 33B is a view illustrating a state in which a plurality of image capturing units move to various points and acquire images.

Referring to FIG. 31, a first rotating unit 41a may move a first image capturing unit 41 to a plurality of points. The configuration of moving the first image capturing unit 41 is not particularly limited. As an example, the first image capturing unit 41 may be finely moved using a fine vibration, and the first image capturing unit 41 may also be moved in one direction using a motor.

Here, as shown in FIG. 32A, the first rotating unit 41a may rotate the first image capturing unit 41 toward an object OBJ1 while moving in the first direction. In addition, as shown in FIG. 32B, the first rotating unit 41a may rotate the first image capturing unit 41 toward the object OBJ1 while moving in the second direction.

As a moving amount of the first image capturing unit 41 increases, a rotation amount may increase together. Accordingly, by moving one image capturing unit, a position of a portrait image in the image may be disposed in the center while acquiring a plurality of images.

Referring to FIG. 33A, the image capturing unit may move to a first point P1, at which a reference image is acquired, and a plurality of points P2, P3, P4, and P5 adjacent to the first point. In this case, the image capturing unit may move and simultaneously rotate towards the object.

Further, as shown in FIG. 33B, a plurality of image capturing units may move to a plurality of points. The first image capturing unit 41 may acquire additional images while moving to a plurality of points P12, P13, P14, and P15 after capturing an image at a reference point P11, and also, the second image capturing unit 42 may acquire additional image while moving to a plurality of points P22, P23, P24, and P25 after capturing an image at a reference point P21. In this case, the first image capturing unit 41 and the second image capturing unit 42 move and simultaneously rotate towards an object.

According to such a configuration, a plurality of images are acquired while moving to a plurality of points so that an image quality of a portrait image may be improved by synthesizing the images. In addition, by rotating the image capturing unit toward an object OBJ1 according to a moving distance, positions of the object OBJ1 in the plurality of images may be the same, thereby reducing a calculation amount. According to such a configuration, there is an advantage in that sufficient light data may be ensured even when the density of pixels in a second display area is increased.

Figure 34:
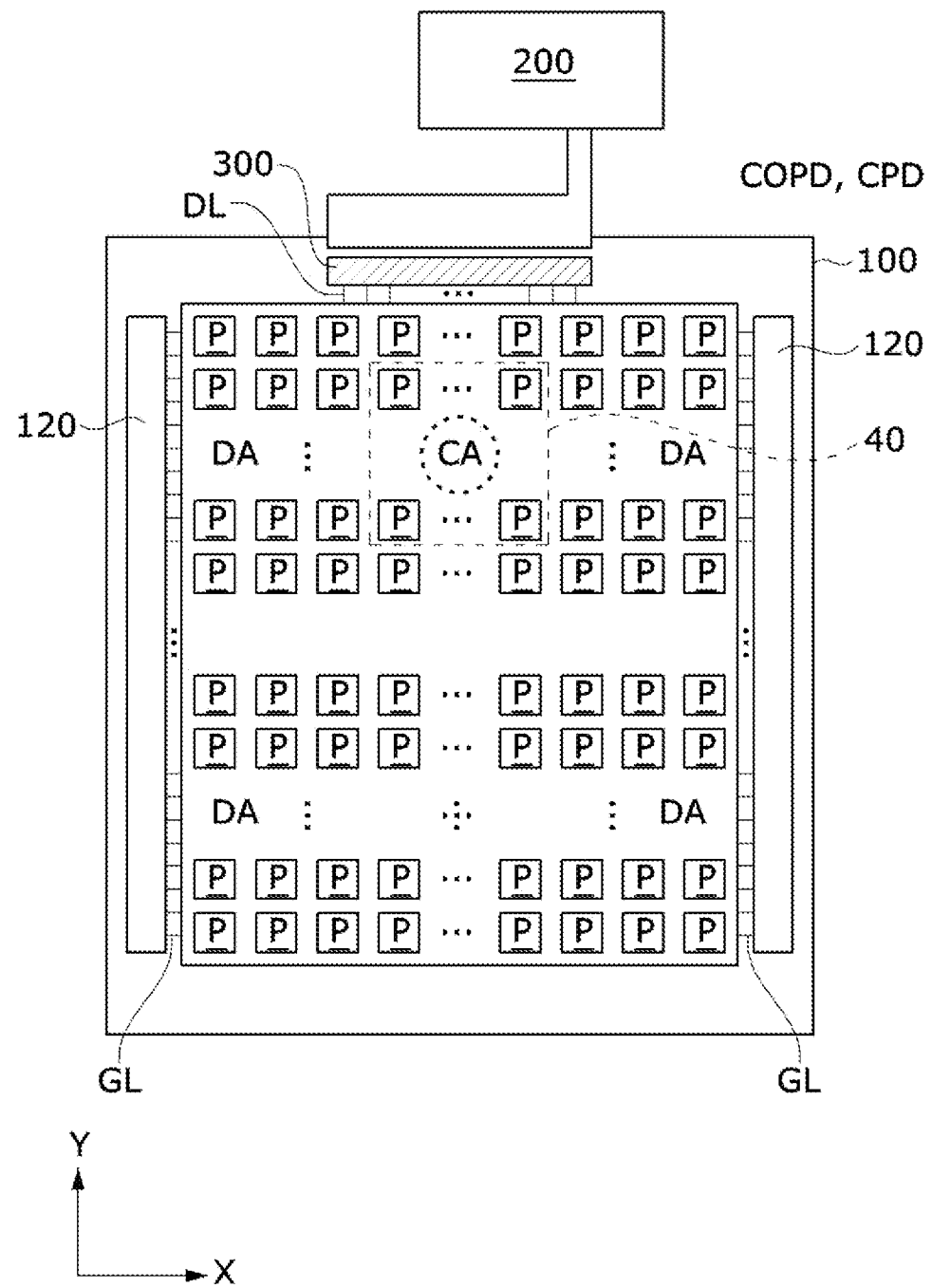
FIG. 34 is a block diagram illustrating a display panel and a display panel driving unit according to an embodiment of the present disclosure.
Figure 35:
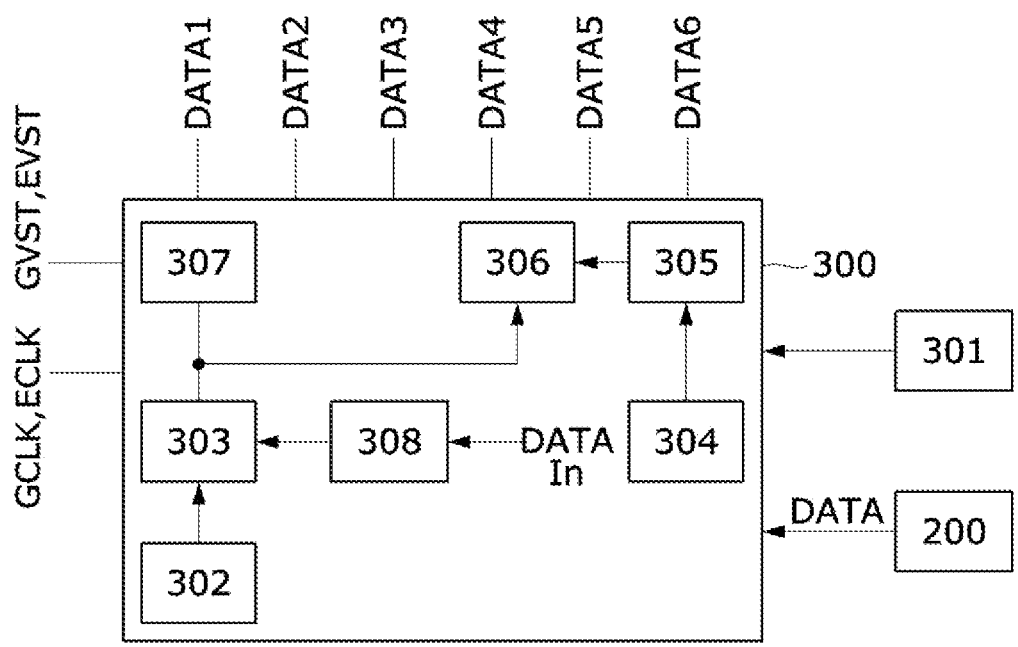
FIG. 35 is a block diagram schematically illustrating a configuration of a driver integrated circuit (IC)

FIG. 34 is a block diagram illustrating a display panel and a display panel driving unit according to an embodiment of the present disclosure, and FIG. 35 is a block diagram schematically illustrating a configuration of a driver integrated circuit (IC).

Referring to FIGS. 34 and 35, the display device may include a display panel 100 having a pixel array disposed on a screen, a display panel driving unit, and the like.

The pixel array of the display panel 100 may include data lines DL, gate lines GL overlapping the data lines DL, and pixels P arranged in a matrix form at regions of overlap of the data lines DL and the gate lines GL.

In the display panel 100, the screen on which an input image is reproduced may include a first display area DA and a second display area CA.

Sub-pixels of each of the first display area DA and the second display area CA may include a pixel circuit. The pixel circuit may include a driving element configured to supply current to a light-emitting element OLED, a plurality of switch elements configured to sample a threshold voltage of the driving element and switch current paths of the pixel circuit, a capacitor configured to maintain a gate voltage of the driving element, and the like. The pixel circuit may be disposed below the light-emitting element.

The second display area CA may include light-transmitting areas TA disposed between pixel groups and a camera module 40 disposed below the second display area CA. In an image capturing mode, the camera module 40 may perform photoelectric conversion on light incident through the second display area CA using an image sensor and convert pixel data of an image, which is output from the image sensor, into digital data to output imaged image data.

The display panel driving unit may write the pixel data of the input image to the pixels P. The pixels P may be interpreted as a pixel group including a plurality of sub-pixels. The display panel driving unit may be a display panel driving circuit or driver, and may be referred to as the display panel driving circuit or the display panel driver.

The display panel driving unit may include a data driving unit or circuit 306 configured to supply a data voltage of the pixel data to the data lines DL, and a gate driving unit or circuit 120 configured to sequentially supply a gate pulse to the gate lines GL. The data driving unit 306 may be integrated into a driver IC 300. The display panel driving unit may further include a touch sensor driving unit or circuit omitted from the drawing.

The driver IC 300 may be attached to the display panel 100. The driver IC 300 receives pixel data of an input image and a timing signal from a host system 200, supplies a data voltage of the pixel data to the pixels, and synchronizes the data driving unit 306 with the gate driving unit 120.

The driver IC 300 may be connected to the data lines DL through data output channels to supply the data voltage of the pixel data to the data lines DL. The driver IC 300 may output a gate timing signal for controlling the gate driving unit 120 through gate timing signal output channels.

The gate timing signal generated from a timing controller 303 may include a gate start pulse VST, a gate shift clock CLK, and the like. The gate start pulse VST and the gate shift clock CLK may swing between a gate-on voltage VGL and a gate-off voltage VGH.

The gate timing signal (VST and CLK) output from a level shifter 307 may be applied to the gate driving unit 120 to control a shift operation of the gate driving unit 120.

The gate driving unit 120 may include a shift register formed on the circuit layer of the display panel 100 together with the pixel array. The shift register of the gate driving unit 120 may sequentially supply a gate signal to the gate lines GL under the control of the timing controller. The gate signal may include a scan pulse and an EM pulse of an emission signal.

The shift register may include a scan driving unit or circuit configured to output the scan pulse, and an EM driving unit or circuit configured to output the EM pulse. In FIG. 35, "GVST" and "GCLK" are gate timing signals that are input to the scan driving unit. "EVST" and "ECLK" are gate timing signals that are input to the EM driving unit.

The driver IC 300 may be connected to the host system 200, a first memory 301, and the display panel 100. The driver IC 300 may include a data reception and computation unit or circuit 308, the timing controller 303, the data driving unit 306, a gamma compensation voltage generation unit or circuit 305, a power supply unit 304 (or simply, "power supply 304"), a second memory 302, and the like.

The data reception and computation unit 308 may include a reception unit or circuit configured to receive pixel data input as a digital signal from the host system 200 and a data computation unit or circuit configured to process the pixel data input through the reception unit to improve image quality.

The data computation unit may include a data restoration unit or circuit configured to perform restoration by decoding compressed pixel data, an optical compensation unit or circuit configured to add a preset optical compensation value to the pixel data, and the like. The optical compensation value may be set as a value for compensating for luminance of each piece of pixel data based on the luminance of the screen that is measured on the basis of a camera image captured in a manufacturing process.

The timing controller 303 may provide the pixel data of the input image received from the host system 200 to the data driving unit 306. The timing controller 303 may generate a gate timing signal for controlling the gate driving unit 120 and a source timing signal for controlling the data driving unit 306 to control operation timing of the gate driving unit 120 and the data driving unit 306.

The data driving unit 306 may convert digital data including the pixel data received from the timing controller 303 into a gamma compensation voltage using a digital-to-analog converter (DAC) and output a data voltage. The data voltage output from the data driving unit 306 may be supplied to the data lines DL of the pixel array through an output buffer connected to a data channel of the driver IC 300.

The gamma compensation voltage generation unit 305 may generate a gamma compensation voltage for each grayscale by dividing a gamma reference voltage received from the power supply unit 304 through a voltage divider circuit. The gamma compensation voltage is an analog voltage in which a voltage is set for each grayscale of the pixel data. The gamma compensation voltage output from the gamma compensation voltage generation unit 305 may be provided to the data driving unit 306.

The power supply unit 304 may generate power beneficial to drive the driver IC 300, the gate driving unit 120, and the pixel array of the display panel 100 using a DC-DC converter. The DC-DC converter may include a charge pump, a regulator, a buck converter, a boost converter, and the like.

The power supply unit 304 may generate DC voltages such as a gamma reference voltage, a gate-on voltage VGL, a gate-off voltage VGH, a pixel driving voltage VDD, a low-potential power supply voltage VSS, an initialization voltage Vini, and the like by adjusting a DC input voltage received from the host system 200.

The gamma reference voltage may be supplied to the gamma compensation voltage generation unit 305. The gate-on voltage VGL and the gate-off voltage VGH may be supplied to the level shifter 307 and the gate driving unit 120. Pixel power voltages such as the pixel driving voltage VDD, the low-potential power supply voltage VSS, and the initialization voltages Vini may be supplied in common to the pixels P.

The initialization voltage Vini may be set to a DC voltage that is lower than the pixel driving voltage VDD and is lower than a threshold voltage of the light-emitting element OLED to initialize main nodes of the pixel circuits and suppress light emission of the light-emitting element OLED.

When power is supplied to the driver IC 300, the second memory 302 may store a compensation value, register setting data, and the like that are received from the first memory 301.

The compensation value may be applied to various algorithms for improving image quality. The compensation value may include the optical compensation value. The register setting data may select operations of the data driving unit 306, the timing controller 303, the gamma compensation voltage generation unit 305, and the like. The first memory 301 may include a flash memory. The second memory 302 may include a static random-access memory (SRAM).

The host system 200 may be implemented as an application processor (AP). The host system 200 may transmit the pixel data of the input image to the driver IC 300 through a mobile industry processor interface (MIPI). The host system 200 may be connected to the driver IC 300 through a flexible printed circuit, for example, a flexible printed circuit (FPC).

The flexible panel may be manufactured as a so-called a "plastic OLED panel." The plastic OLED panel may include a back plate and a pixel array formed on an organic thin film adhered to the back plate. A touch sensor array may be formed on the pixel array.

The back plate may be a polyethylene terephthalate (PET) substrate. The pixel array and the touch sensor array may be formed on the organic thin film. The back plate may block the permeation of moisture to the organic thin film so that the pixel array is not exposed to moisture.

The organic thin film may be a polyimide (PI) substrate. A multilayer buffer film may be formed of an insulating material (not shown) on the organic thin film. The circuit layer 12 and the light-emitting element layer 14 may be stacked on the organic thin film.

In the display device of the present disclosure, the pixel circuit and the gate driving unit disposed on the circuit layer 12 may include a plurality of transistors. The transistors may be implemented as oxide TFTs including an oxide semiconductor, low-temperature polysilicon (LTPS) TFTs including LTPS, and the like. Each of the transistors may be implemented as a p-channel TFT or an n-channel TFT. The following embodiments will be described focusing on an example in which the transistors of the pixel circuit are implemented as p-channel TFTs, but the present disclosure is not limited thereto.

The transistors are three-electrode elements including a gate, a source, and a drain. The source is an electrode that provides carriers to the transistor. The carriers in the transistor may start to flow from the source. The drain is an electrode through which the carriers are discharged from the transistor to the outside.

In the transistor, carriers flow from the source to the drain. In the case of an n-channel transistor, carriers are electrons, and thus a source voltage is lower than a drain voltage so that the electrons flow from the source to the drain. In the n-channel transistor, current flows from the drain to the source.

In the case of a p-channel transistor (PMOS), carriers are holes, and thus a source voltage is higher than a drain voltage so that the holes flow from the source to the drain. In the p-channel transistor, since the holes flow from the source to the drain, current flows from the source to the drain. It should be noted that the source and the drain of the transistor are not fixed in position. For example, the source and the drain are interchangeable depending on the applied voltage. Accordingly, the present disclosure is not limited by the source and the drain of the transistor. In the following description, the source and the drain of the transistor will be referred to as a first electrode and a second electrode.

A gate pulse may swing between a gate-on voltage and a gate-off voltage. The gate-on voltage may be set to be higher than a threshold voltage of the transistor, and the gate-off voltage may be set to be lower than the threshold voltage of the transistor.

The transistor may be turned on in response to the gate-on voltage and turned off in response to the gate-off voltage. In the case of an n-channel transistor, the gate-on voltage may be a gate-high voltage VGH, and the gate-off voltage may be a gate-low voltage VGL. In the case of a p-channel transistor, the gate-on voltage may be a gate-low voltage VGL, and the gate-off voltage may be a gate-high voltage VGH.

The driving element of the pixel circuit may be implemented as a transistor. The driving element should have uniform electrical characteristics between all the pixels, but there may be differences in electrical characteristics between the pixels due to a process variation and an element characteristic variation, and the electrical characteristics may vary as a display driving time passes.

In order to compensate for the electrical characteristic variation of the driving element, the display device may include an internal compensation circuit and an external compensation circuit. The internal compensation circuit may be added to the pixel circuit in each of the sub-pixels to sample a threshold voltage Vth and/or a mobility u of the driving element, which vary according to the electrical characteristics of the driving element, and compensate for the variation in real time.

The external compensation circuit may transmit the threshold voltage and/or mobility of the driving element, which are sensed through the sensing line connected to each of the sub-pixels, to an external compensation unit or circuit. The compensation unit or circuit of the external compensation circuit may reflect the sensing result to modulate the pixel data of the input image, thereby compensating for the variation in the electrical characteristics of the driving element.

By sensing a voltage of the pixel, which varies according to electrical characteristics of an external compensation driving element, and modulating data of an input image in an external circuit based on the sensed voltage, it is possible to compensate for the variation in the electrical characteristics of the driving element between the pixels.

Figure 36:
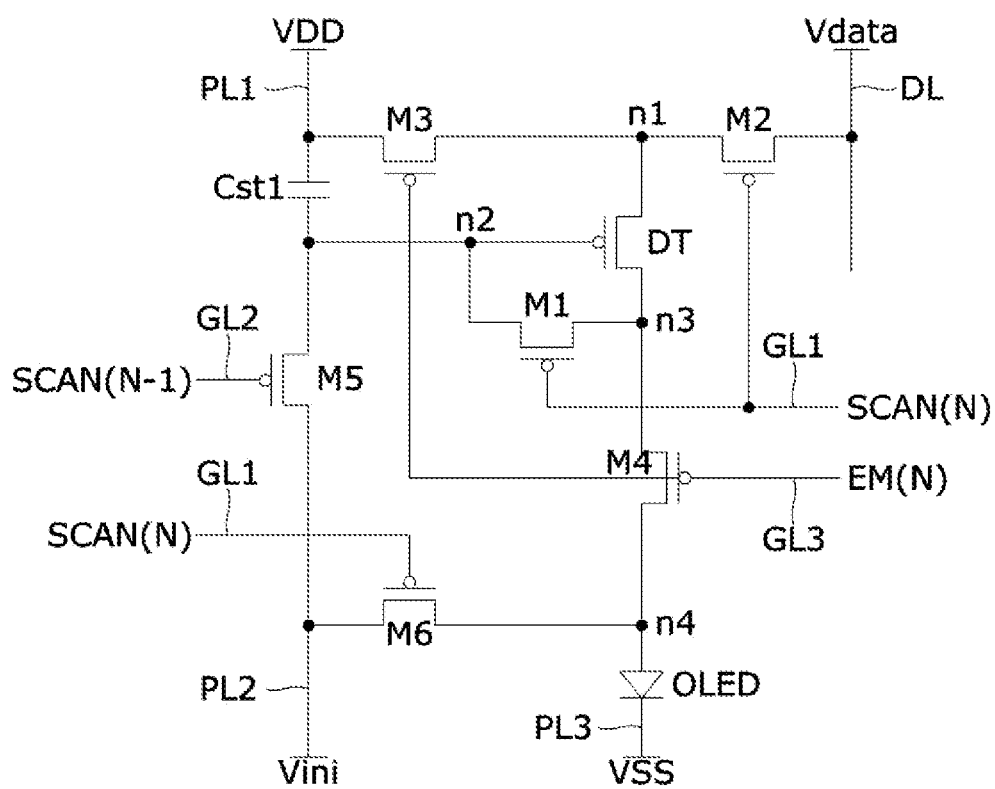
FIG. 36 is a circuit diagram illustrating an example of a pixel circuit.
Figure 37:
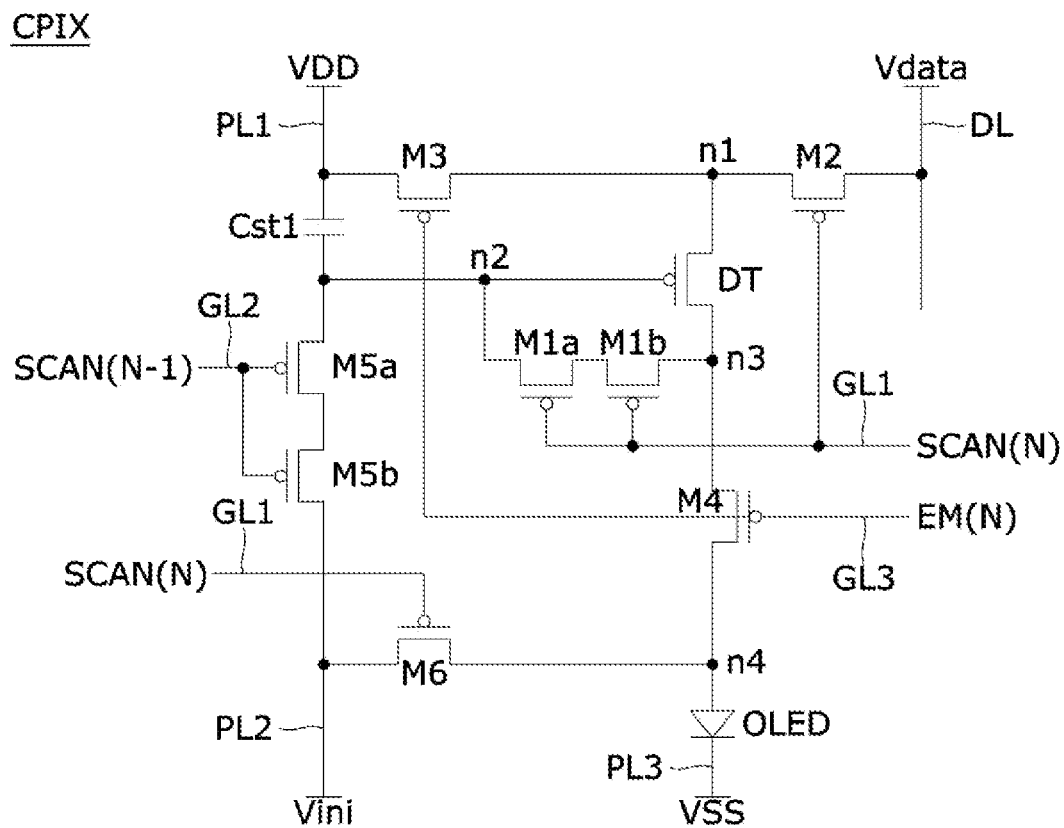
FIG. 37 is a circuit diagram illustrating another example of the pixel circuit.
Figure 38:
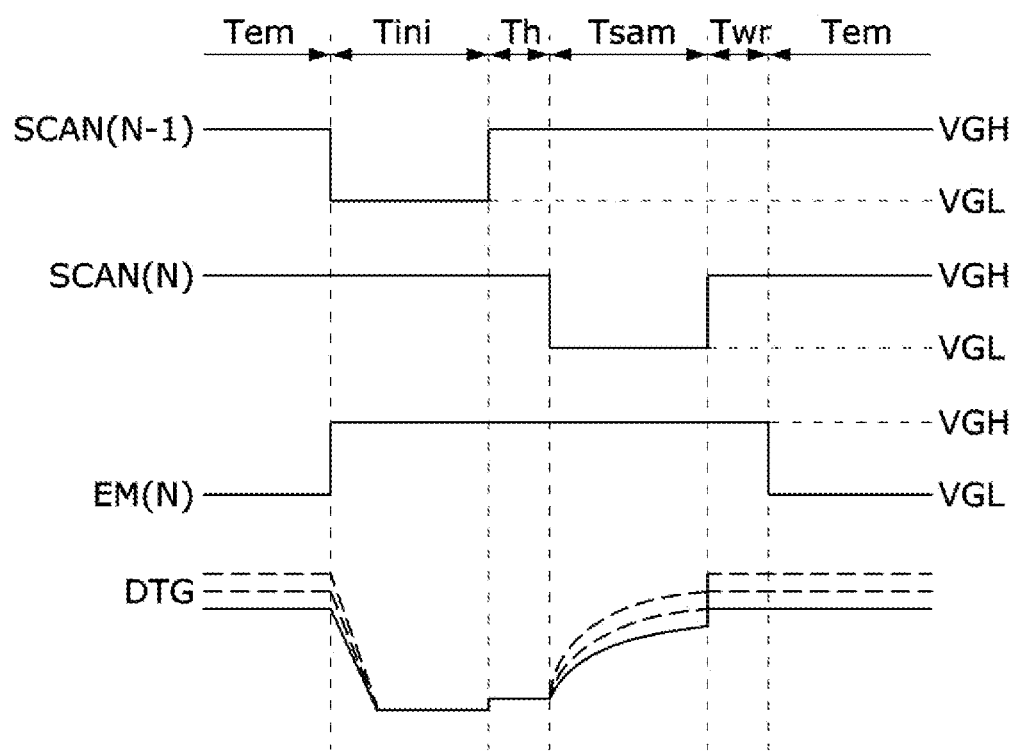
FIG. 38 is a view illustrating a method of driving the pixel circuit.

FIG. 36 is a circuit diagram illustrating an example of the pixel circuit, and FIG. 37 is a circuit diagram illustrating another example of the pixel circuit. FIG. 38 is a diagram illustrating a method of driving the pixel circuits shown in FIGS. 36 and 37.

The pixel circuits shown in FIGS. 36 and 37 may be similarly applied to the pixel circuit of the first display area DA and the second display area CA. The pixel circuit applicable to the present disclosure may be implemented as the circuits shown in FIGS. 36 and 37, but the present disclosure is not limited thereto.

Referring to FIGS. 36 to 38, the pixel circuit may include a light-emitting element OLED, a driving element DT configured to supply current to the light-emitting element OLED, and an internal compensation circuit configured to sample a threshold voltage Vth of the driving element DT using a plurality of switch elements M1 to M6 and compensate a gate voltage of the driving element DT by as much as the threshold voltage Vth of the driving element DT. Each of the driving element DT and the switch elements M1 to M6 may be implemented as a p-channel TFT.

A driving period of the pixel circuit using the internal compensation circuit may be divided into an initialization period Tini, a sampling period Tsam, a data writing period Twr, and a light emission period Tem, as shown in FIG. 38.

During the initialization period Tini, an N−1th scan signal SCAN (N−1) is generated as a pulse of a gate-on voltage VGL, and a voltage of each of an Nth scan signal SCAN (N) and an emission signal EM (N) is a gate-off voltage VGH. During the sampling period Tsam, the Nth scan signal SCAN (N) is generated as a pulse of the gate-on voltage VGL, and a voltage of each of the N−1th scan signal SCAN (N−1) and the emission signal EM (N) is the gate-off voltage VGH. During the data writing period Twr, a voltage of each of the N−1th scan signal SCAN (N−1), the Nth scan signal SCAN (N), and the emission signal EM (N) is the gate-off voltage VGH. During at least a partial period of the light emission period Tem, the emission signal EM (N) may be generated as the gate-on voltage VGL, and a voltage of each of the N−1th scan signal SCAN (N−1) and the Nth scan signal SCAN (N) may be generated as the gate-off voltage VGH.

During the initialization period Tini, a fifth switch element M5 may be turned on according to the gate-on voltage VGL of the N−1th scan signal SCAN (N−1) to initialize the pixel circuit. During the sampling period Tsam, first and second switch elements M1 and M2 may be turned on according to the gate-on voltage VGL of the Nth scan signal SCAN (N) so that the threshold voltage of the driving element DT may be sampled and stored in a storage capacitor Cst1. At the same time, a sixth switch element M6 may be turned on during the sampling period Tsam to lower a voltage of a fourth node n4 to a reference voltage Vref to suppress light emission of the light-emitting element OLED. During the data writing period Twr, the first to sixth switch elements M1 to M6 may be maintained in an OFF state. During the light emission period Tem, the third and fourth switch elements M3 and M4 may be turned on so that the light-emitting element OLED may emit light. In the light emission period Tem, in order to precisely express a luminance of a low grayscale with a duty ratio of the emission signal EM (N), the emission signal EM (N) may swing between the gate-on voltage VGL and the gate-off voltage VGH at a predetermined or selected duty ratio to repeat turning the third and fourth switch elements M3 and M4 on and off.

The light-emitting element OLED may be implemented as an organic light-emitting diode or an inorganic light-emitting diode. Hereinafter, an example in which the light-emitting element OLED is implemented as an organic light-emitting diode will be described.

The light-emitting element OLED may include an organic compound layer formed between an anode and a cathode. The organic compound layer may include a hole injection layer HIL, a hole transport layer HTL, an emission layer EML, an electron transport layer ETL, and an electron injection layer EIL, but the present disclosure is not limited thereto. When a voltage is applied to the anode and the cathode of the OLED, holes passing through the hole transport layer HTL and electrons passing through the electron transport layer ETL move to the emission layer EML to create excitons, and thus visible light may be emitted from the emission layer EML.

The anode of the light-emitting element OLED may be connected to the fourth node n4 between the fourth and sixth switch elements M4 and M6. The fourth node n4 may be connected to the anode of the light-emitting element OLED, a second electrode of the fourth switch element M4, and a second electrode of the sixth switch element M6. The cathode of the light-emitting element OLED may be connected to a VSS line PL3 to which the low-potential power supply voltage VSS is applied. The light-emitting element OLED may emit light with a current Ids that flows according to a gate-source voltage Vgs of the driving element DT. The third and fourth switch elements M3 and M4 may switch current paths of the light-emitting element OLED.

The storage capacitor Cst1 may be connected between a VDD line PL1 and a second node n2. A data voltage Vdata, which is compensated for by as much as the threshold voltage Vth of the driving element DT, may be charged to the storage capacitor Cst1. Since the data voltage Vdata in each sub-pixel is compensated for by as much as the threshold voltage Vth of the driving element DT, a characteristic deviation of the driving element DT in each sub-pixel may be compensated for.

The first switch element M1 may be turned on in response to the gate-on voltage VGL of the Nth scan signal SCAN (N) to connect a second node n2 to a third node n3. The second node n2 may be connected to a gate electrode of the driving element DT, a first electrode of the storage capacitor Cst1, and a first electrode of the first switch element M1. The third node n3 may be connected to a second electrode of the driving element DT, a second electrode of the first switch element M1, and a first electrode of the fourth switch element M4. A gate electrode of the first switch element M1 may be connected to a first gate line GL1 to receive the Nth scan signal SCAN (N). The first electrode of the first switch element M1 may be connected to the second node n2, and the second electrode thereof may be connected to the third node n3.

The first switch element M1 may be turned on only in a very short one horizontal period 1H during which the Nth scan signal SCAN (N) is generated as the gate-on voltage VGL in one frame period and thus may be maintained in an OFF state for about one frame period, and thus a leakage current may be generated in the OFF state of the first switch element M1. In order to suppress the leakage current of the first switch element M1, the first switch element M1 may be implemented as a dual-gate structure transistor having two transistors M1a and M1b connected in series, as shown in FIG. 37.

The second switch element M2 may be turned on in response to the gate-on voltage VGL of the Nth scan signal SCAN (N) to supply the data voltage Vdata to the first node n1. A gate electrode of the second switch element M2 may be connected to the first gate line GL1 to receive the Nth scan signal SCAN (N). A first electrode of the second switch element M2 may be connected to the first node n1. A second electrode of the second switch element M2 may be connected to a data line DL to which the data voltage Vdata is applied. The first node n1 may be connected to the first electrode of the second switch element M2, a second electrode of the third switch element M3, and a first electrode of the driving element DT.

The third switch element M3 may be turned on in response to the gate-on voltage VGL of the emission signal EM (N) to connect the VDD line PL1 to the first node n1. A gate electrode of the third switch element M3 may be connected to a third gate line GL3 to receive the emission signal EM (N). A first electrode of the third switch element M3 may be connected to the VDD line PL1. The second electrode of the third switch element M3 may be connected to the first node n1.

The fourth switch element M4 may be turned on in response to the gate-on voltage VGL of the emission signal EM (N) to connect the third node n3 to the anode of the light-emitting element OLED. A gate electrode of the fourth switch element M4 may be connected to the third gate line GL3 to receive the emission signal EM (N). The first electrode of the fourth switch element M4 may be connected to the third node n3, and the second electrode thereof may be connected to the fourth node n4.

The fifth switch element M5 may be turned on in response to the gate-on voltage VGL of the N-1th scan signal SCAN (N-1) to connect the second node n2 to a Vini line PL2. A gate electrode of the fifth switch element M5 may be connected to a second gate line GL2 to receive the N-1th scan signal SCAN (N-1). A first electrode of the fifth switch element M5 may be connected to the second node n2, and a second electrode thereof may be connected to the Vini line PL2. In order to suppress a leakage current of the fifth switch element M5, the fifth switch element M5 may be implemented as a dual-gate structure transistor having two transistors M5a and M5b connected in series, as shown in FIG. 37.

The sixth switch element M6 may be turned on in response to the gate-on voltage VGL of the Nth scan signal SCAN (N) to connect the Vini line PL2 to the fourth node n4. A gate electrode of the sixth switch element M6 may be connected to the first gate line GL1 to receive the Nth scan signal SCAN (N). A first electrode of the sixth switch element M6 may be connected to the Vini line PL2, and the second electrode thereof may be connected to the fourth node n4.

The driving element DT may adjust the current Ids, which flows in the light-emitting element OLED according to the gate-source voltage Vgs, to drive the light-emitting element OLED. The driving element DT may include the gate electrode connected to the second node n2, the first electrode connected to the first node n1, and the second electrode connected to the third node n3.

As shown in FIG. 38, the N-1th scan signal SCAN (N-1) may be generated as the gate-on voltage VGL during the initialization period Tini. During the initialization period Tini, the Nth scan signal SCAN (N) and the emission signal EM (N) may each be maintained at the gate-off voltage VGH. Thus, during the initialization period Tini, the fifth switch element M5 may be turned on so that the second and fourth nodes n2 and n4 may each be initialized to "Vini." A hold period Th may be set between the initialization period Tini and the sampling period Tsam. During the hold period Th, the gate pulseSCAN (N), and EM (N) may be maintained in previous states thereof.

During the sampling period Tsam, the Nth scan signal SCAN (N) may be generated as the gate-on voltage VGL. The Nth scan signal SCAN (N) may be synchronized with the data voltage Vdata of an Nth pixel line. During the sampling period Tsam, the N-1th scan signal SCAN (N-1) and the emission signal EM (N) may each be maintained at the gate-off voltage VGH. Thus, during the sampling period Tsam, the first and second switch elements M1 and M2 may be turned on.

During the sampling period Tsam, a gate voltage DTG of the driving element DT may rise due to a current flowing through the first and second switch elements M1 and M2. When the driving element DT is turned off, the gate voltage DTG is Vdata-|Vth|. In this case, the voltage of the first node n1 is also Vdata-|Vth|. During the sampling period Tsam, the gate-source voltage Vgs of the driving element DT is |Vgs|=Vdata-(Vdata-|Vth|)=|Vth|.

During the data writing period Twr, the Nth scan signal SCAN (N) may be inverted to the gate-off voltage VGH. During the data writing period Twr, the N-1th scan signal SCAN (N-1) and the emission signal EM (N) may each be maintained at the gate-off voltage VGH. Thus, during the data writing period Twr, all the switch elements M1 to M6 may be maintained in an OFF state.

During the light emission period Tem, the emission signal EM (N) may be generated as the gate-on voltage VGL. During the light emission period Tem, in order to improve a low grayscale representation, the emission signal EM (N) may be turned on and off at a predetermined or selected duty ratio to swing between the gate-on voltage VGL and the gate-off voltage VGH. Accordingly, the emission signal EM (N) may be generated as the gate-on voltage VGL for at least a partial period of the light emission period Tem.

When the emission signal EM (N) is at the gate-on voltage VGL, current flows between "VDD" and the light-emitting element OLED so that the light-emitting element OLED may emit light. During the light emission period Tem, the N-1th and Nth scan signals SCAN (N-1) and SCAN (N) may each be maintained at the gate-off voltage VGH. During the light emission period Tem, the third and fourth switch elements M3 and M4 may be repeatedly turned on and off according to the voltage of the emission signal EM (N). When the emission signal EM (N) is at the gate-on voltage VGL, the third and fourth switch elements M3 and M4 are turned on so that current flows in the light-emitting element OLED. In this case, "Vgs" of the driving element DT satisfies |Vgs|=VDD-(Vdata-|Vth|), and the current flowing in the light-emitting element OLED is K(VDD-Vdata) 2.

"K" is a constant determined by charge mobility, parasitic capacitance, and a channel capacity of the driving element DT.

Figure 39:
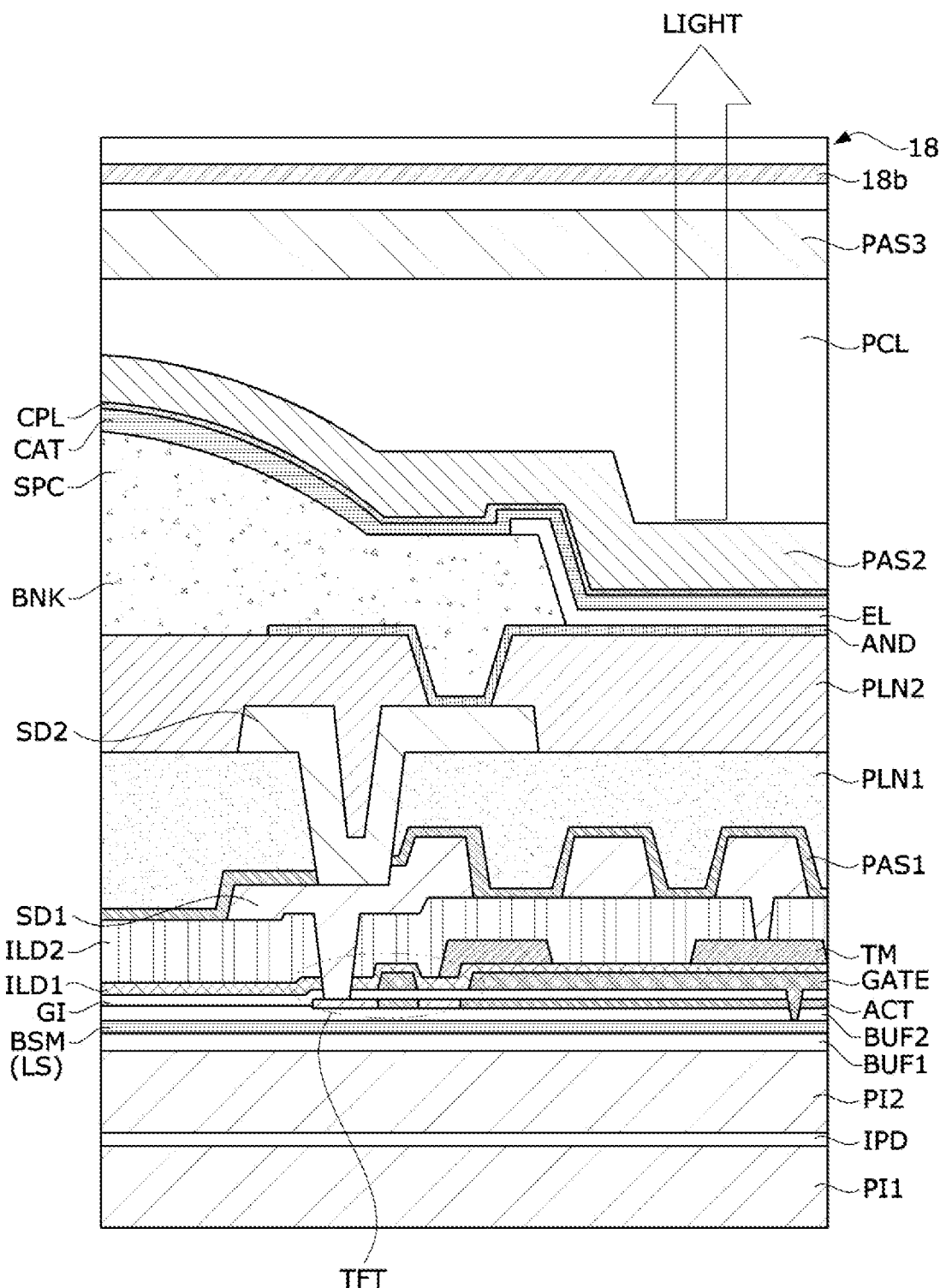
FIG. 39 is a cross-sectional view illustrating a cross-sectional structure of a pixel area in detail in a display panel according to one embodiment of the present disclosure.
Figure 40:
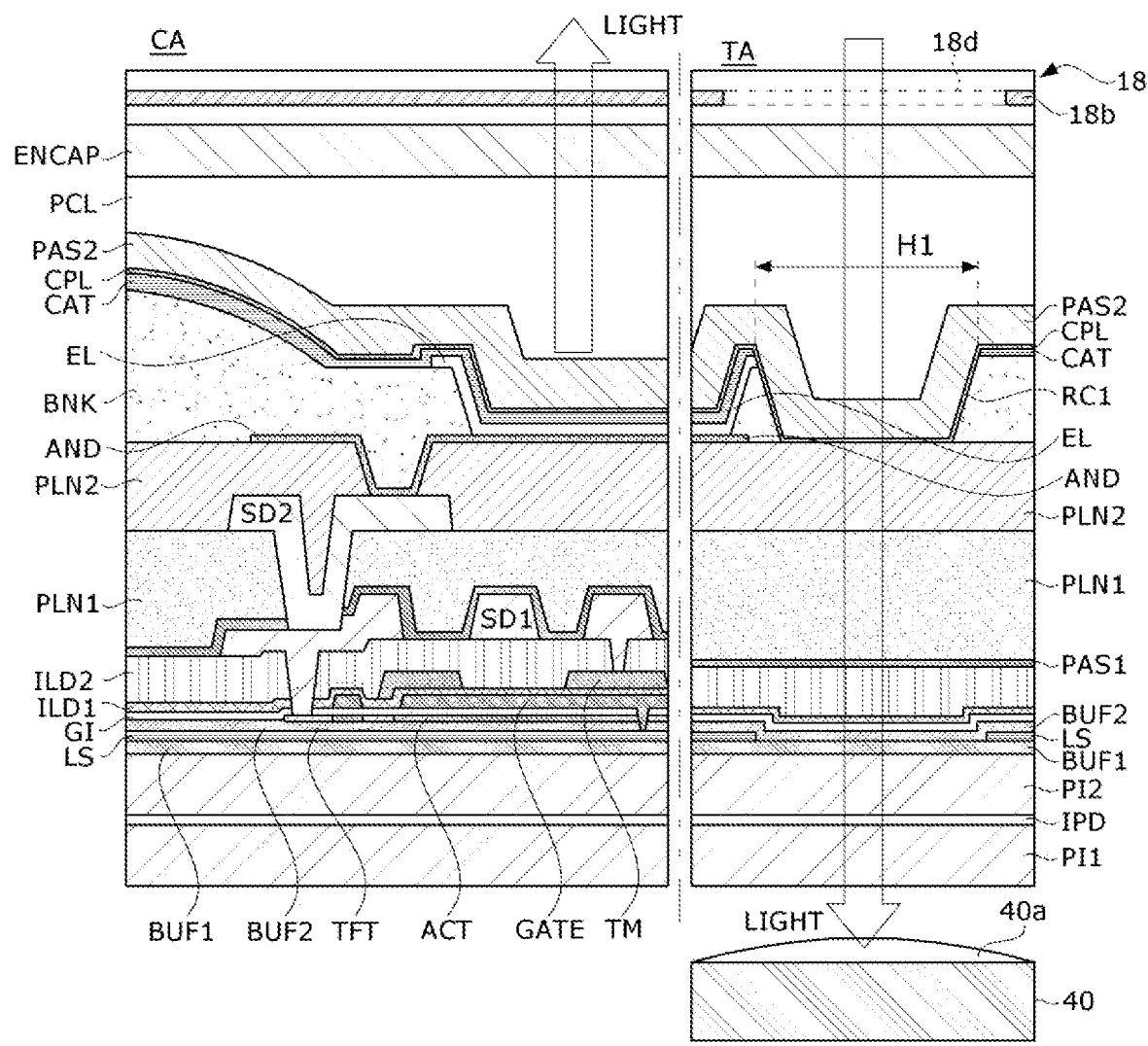
FIG. 40 illustrates a cross-sectional structure of the pixel area and the light-transmitting area of the second display area according to one embodiment of the present disclosure.

FIG. 39 is a cross-sectional view illustrating a cross-sectional structure of a pixel area in a display panel according to one embodiment of the present disclosure in detail, and FIG. 40 illustrates a cross-sectional structure of the pixel area and a light-transmitting area according to one embodiment of the present disclosure.

The cross-sectional structure of the display panel 100 is not limited to that in FIG. 39. In FIG. 39, "TFT" represents a driving element DT of the pixel circuit.

Referring to FIG. 39, a circuit layer, a light-emitting element layer, and the like may be stacked on substrates PI1 and PI2 in a pixel area PIX. The substrates PI1 and PI2 may include a first PI substrate PI1 and a second PI substrate PI2. An inorganic film IPD may be formed between the first PI substrate PI1 and the second PI substrate PI2. The inorganic film IPD may block the penetration of moisture.

A first buffer layer BUF1 may be formed on the second PI substrate PI2. A first metal layer may be formed on the first buffer layer BUF1, and a second buffer layer BUF2 may be formed on the first metal layer.

The first metal layer may be patterned by a photolithography process. The first metal layer may include a light shield pattern BSM. The light shield pattern BSM may block external light so that the light does not irradiate to an active layer of a TFT, thereby preventing a photo current of the TFT formed in the pixel area from generating.

When the light shield pattern BSM is formed of a metal having a low absorption coefficient of a laser wavelength used in a laser ablation process as compared to a metal layer (e.g., a cathode) to be removed from the second display area CA, the light shield pattern BSM may also serve as a light shield layer LS configured to block a laser beam LB in the laser ablation process.

Each of the first and second buffer layers BUF1 and BUF2 may be made of an inorganic insulating material and may be formed of one or more insulating layers.

An active layer ACT may be made of a semiconductor material deposited on the second buffer layer BUF2 and may be patterned by a photo-lithography process. The active layer ACT may include an active pattern of each of TFTs of the pixel circuit and TFTs of the gate driving unit. A portion of the active layer ACT may be metallized by ion doping. The metallized portion may be used as a jumper pattern connecting the metal layers at some nodes of the pixel circuit to connect components of the pixel circuit.

A gate insulating layer GI may be formed on the second buffer layer BUF2 so as to cover the active layer ACT. The gate insulating layer GI may be made of an inorganic insulating material. A second metal layer may be formed on the gate insulating layer GI. The second metal layer may be patterned by a photo-lithography process. The second metal layer may include a gate line, a gate electrode pattern GATE, a lower electrode of the storage capacitor Cst1, a jumper pattern connecting patterns of the first metal layer and a third metal layer, and the like.

A first interlayer insulating layer ILD1 may be formed on the gate insulating layer GI so as to cover the second metal layer. The third metal layer may be formed on the first interlayer insulating layer ILD1, and a second interlayer insulating layer ILD2 may cover the third metal layer. The third metal layer may be patterned by a photo-lithography process. The third metal layer may include metal patterns TM, such as an upper electrode of the storage capacitor Cst1.

The first and second interlayer insulating layers ILD1 and ILD2 may each include an inorganic insulating material.

A fourth metal layer may be formed on the second interlayer insulating layer ILD2, and an inorganic insulating layer PAS1 and a first planarization layer PLN1 may be stacked on the fourth metal layer. A fifth metal layer may be formed on the first planarization layer PLN1.

Some patterns of the fourth metal layer may be connected to the third metal layer through a contact hole passing through the first planarization layer PLN1 and the inorganic insulating layer PAS1. The first and second planarization layers PLN1 and PLN2 may each be made of an organic insulating material enabling surfaces thereof to be flat.

The fourth metal layer may include first and second electrodes of a TFT connected to an active pattern of the TFT through a contact hole passing through the second interlayer insulating layer ILD2. The data line DL and the power lines may be implemented using a pattern SD1 of the fourth metal layer or a pattern SD2 of the fifth metal layer.

An anode AND, which is a first electrode layer of the light-emitting element OLED, may be formed on the second planarization layer PLN2. The anode AND may be connected to an electrode of a TFT used as the switch element or the driving element through a contact hole passing through the second planarization layer PLN2. The anode AND may be made of a transparent or semitransparent electrode material.

A pixel-defining film BNK may cover the anode AND of the light-emitting element OLED. The pixel-defining film BNK may be formed in a pattern that is adjacent an emission area (or an opening area) through which light passes to the outside from each of the pixels. A spacer SPC may be formed on the pixel-defining film BNK. The pixel-defining film BNK and the spacer SPC may be integrated with the same organic insulating material. The spacer SPC may ensure a gap between a fine metal mask (FMM) and the anode AND so that the FMM is not in contact with the anode AND in a deposition process of an organic compound EL. The pixel-defining film BNK may be a bank, and may be referred to as the bank BNK.

The organic compound EL may be formed in the emission area of each of the pixels, which is adjacent the pixel-defining film BNK. A cathode CAT, which is a second electrode layer of the light-emitting element OLED, may be formed on the entire surface of the display panel 100 so as to cover the pixel-defining film BNK, the spacer SPC, and the organic compound EL. The cathode CAT may be connected to the VSS line PL3 formed of any one of the metal layers therebelow. A capping layer CPL may cover the cathode CAT. The capping layer CPL may be made of an inorganic insulating material to block the penetration of the air and out-gassing from the organic insulating material, which is applied on the capping layer CPL, to protect the cathode CAT. An inorganic insulating layer PAS2 may cover the capping layer CPL, and the planarization layer PCL may be formed on the inorganic insulating layer PAS2. The planarization layer PCL may include an organic insulating material. An inorganic insulating layer PAS3 of the encapsulation layer may be formed on the planarization layer PCL.

The polarizing plate 18 may be disposed on the inorganic insulating layer PAS3 to improve the outdoor visibility of the display device. The polarizing plate 18 may reduce the reflection of light from a surface of the display panel 100 and block the light reflected from metal of the circuit layer 12, thereby improving the brightness of the pixels.

Referring to FIG. 40, a partial area of each of the anode AND and the light-emitting element EL disposed in the second display area CA may extend to the light-transmitting area TA. Thus, the luminance of the light-transmitting area TA may be increased and uniform image quality may be realized. However, the present disclosure is not necessarily limited thereto, and the light-emitting element EL and the anode AND may not be overlapped with the light-transmitting area TA.

Further, in the light-transmitting area TA, a first light-transmitting pattern 18d may be formed in the polarizing plate 18. The first light-transmitting pattern 18d may be formed by discoloring the polarizer 18b using a laser, or the first light-transmitting pattern 18d may be formed by partially removing the polarizer 18b.

In the light-transmitting area TA, an opening H1 may be formed in the cathode CAT. The opening H1 may be formed by forming the cathode CAT on the pixel-defining film BNK and then etching the cathode CAT and the pixel-defining film BNK at once. Accordingly, a first groove RC1 may be formed in the pixel-defining film BNK, and the opening H1 of the cathode CAT may be formed on the first groove RC1. However, the present disclosure is not necessarily limited thereto, and the cathode CAT may be disposed on the second planarization layer PLN2 without forming the pixel-defining film BNK in the light-transmitting area TA.

In the light-transmitting area TA, the first light-transmitting pattern 18d is formed in the polarizing plate 18, and the opening H1 is formed in the cathode so that light transmittance may be improved. Thus, a sufficient amount of light may be introduced into the camera module 40 so that camera performance may be improved. In addition, noise of imaged image data may be reduced.

Figure 41:
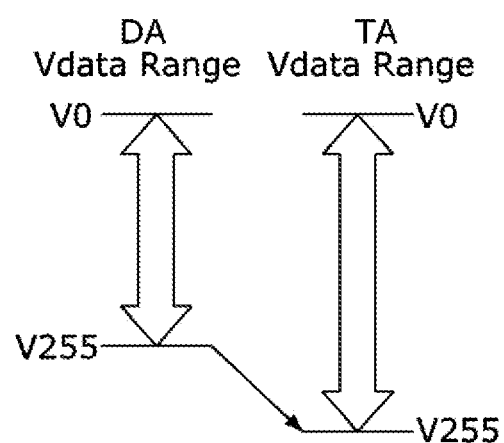
FIG. 41 is a view illustrating a data voltage applied to pixels of the first display area and a data voltage applied to pixels of the second display area.

FIG. 41 is a view illustrating a data voltage applied to the pixels of the first display area and a data voltage applied to the pixels of the second display area.

Referring to FIG. 41, since the PPI of the second display area CA is relatively lower than that of the first display area DA, the data driving unit may enlarge the range of the data voltage Vdata applied to the pixels of the second display area CA as compared to the range of the data voltage Vdata applied to the pixels of the first display area DA.

According to an embodiment, the quality of an image captured by a front camera of a full-screen display can be improved.

Effects of the present disclosure will not be limited to the above-mentioned effects and other unmentioned effects will be clearly understood by those skilled in the art from the following claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a display panel including a first display area and a second display area;
a first image capturing assembly disposed below the second display area;
a second image capturing assembly disposed below the second display area;
a rotating actuator configured to rotate the second image capturing assembly, and
a processor configured to control the first image capturing assembly and the second image capturing assembly,
wherein the processor generates a synthesized image using a first image acquired by the first image capturing assembly and a second image acquired by the second image capturing assembly, and
wherein the processor extracts an image of an object from the second image, and generates the synthesized image using the first image and the image of the object extracted from the second image.

2. The display device of claim 1, wherein the second display area has a lower pixel density than the first display area.

3. The display device of claim 1, wherein the rotating actuator rotates the second image capturing assembly toward an object to be captured by the first image capturing assembly.

4. The display device of claim 1, further comprising:
a distance sensor, wherein the rotating actuator adjusts an amount of rotation of the second image capturing assembly according to a distance to an object, the distance being measured by the distance sensor.

5. The display device of claim 4, wherein the distance sensor is disposed below the second display area.

6. The display device of claim 4, wherein the amount of rotation of the second image capturing assembly is increased as the distance to the object is smaller.

7. The display device of claim 1, wherein the rotating actuator rotates the second image capturing assembly such that an optical axis of the second image capturing assembly intersects an optical axis of the first image capturing assembly.

8. The display device of claim 1, wherein the rotating actuator includes an actuator configured to rotate an optical axis of the second image capturing assembly.

9. The display device of claim 1, wherein the rotating actuator includes a lens disposed on a front side of the second image capturing assembly and an actuator configured to rotate the lens.

10. The display device of claim 1, wherein the processor extracts a feature point of the object extracted from the second image, and rotates the extracted object on the basis of the feature point to match the extracted object with an object of the first image.

11. The display device of claim 1, further comprising:
a sub-rotating actuator configured to rotate the first image capturing assembly,
wherein the processor determines whether the first image capturing assembly rotates depending on a position of an object in the first image.

12. A display device, comprising:
a display panel including a first display area and a second display area;
a first image capturing assembly disposed below the second display area;
a second image capturing assembly disposed below the second display area; and a rotating actuator configured to rotate the second image capturing assembly, wherein the rotating actuator includes a moving actuator configured to move the second image capturing assembly, and wherein the rotating actuator adjusts an amount of rotation of the second image capturing assembly according to a position to which the second image capturing assembly moves.

13. The display device of claim 11, wherein the sub-rotating actuator includes a moving actuator configured to move the first image capturing assembly.

14. The display device of claim 1, wherein
the first image capturing assembly and the second image capturing assembly are disposed below the plurality of second pixel groups and the plurality of light-transmitting areas.

15. The display device of claim 14, wherein a polarizing plate disposed above the first image capturing assembly and the second image capturing assembly includes a light-transmitting pattern corresponding to at least one of the plurality of light-transmitting areas.

16. The display device of claim 14, wherein a range of a data voltage applied to the second pixel group is larger than a range of a data voltage applied to the first pixel group.

17. A method of synthesizing images, comprising:
receiving an image capturing signal;
acquiring distance information of an object;
determining whether a second image capturing assembly needs to be rotated based on the distance information;
rotating the second image capturing assembly with a selected angle when it is determined that the second image capturing assembly needs to be rotated;
acquiring a first image using a first image capturing assembly and a second image using the second image capturing assembly; and
synthesizing the first and second images,
wherein synthesizing the first image and the second image is to extract an image of an object from the second image and to generates the synthesized image using the first image and the image of the object extracted from the second image.

* * * * *